(12) United States Patent
Schneiter et al.

(10) Patent No.: US 11,761,085 B2
(45) Date of Patent: Sep. 19, 2023

(54) COMPOSITE TAPE WITH LCVD-FORMED ADDITIVE MATERIAL IN CONSTITUENT LAYER(S)

(71) Applicant: FREE FORM FIBERS, LLC, Saratoga Springs, NY (US)

(72) Inventors: John L. Schneiter, Cohoes, NY (US); John Novalis, Raleigh, NC (US); Shay L. Harrison, East Greenbush, NY (US)

(73) Assignee: FREE FORM FIBERS, LLC, Saratoga Springs, NY (US)

( * ) Notice: Subject to any disclaimer, the term of this patent is extended or adjusted under 35 U.S.C. 154(b) by 0 days.

(21) Appl. No.: 17/408,922

(22) Filed: Aug. 23, 2021

(65) Prior Publication Data

US 2022/0064798 A1    Mar. 3, 2022

Related U.S. Application Data

(60) Provisional application No. 63/072,333, filed on Aug. 31, 2020.

(51) Int. Cl.
| | |
|---|---|
| *C23C 16/48* | (2006.01) |
| *C23C 16/32* | (2006.01) |
| *B32B 27/18* | (2006.01) |
| *B32B 5/02* | (2006.01) |

(52) U.S. Cl.
CPC ............. *C23C 16/483* (2013.01); *B32B 5/02* (2013.01); *B32B 27/18* (2013.01); *C23C 16/325* (2013.01); *B32B 2264/107* (2013.01); *B32B 2405/00* (2013.01)

(58) Field of Classification Search
None
See application file for complete search history.

(56) References Cited

U.S. PATENT DOCUMENTS

| | | |
|---|---|---|
| 3,062,683 A | 11/1962 | Kalleberg et al. |
| 3,148,102 A | 9/1964 | Eakins et al. |
| 3,535,187 A | 10/1970 | Wood |

(Continued)

FOREIGN PATENT DOCUMENTS

| | | |
|---|---|---|
| CN | 103387230 A | 11/2013 |
| CN | 104185314 A | 8/2014 |

(Continued)

OTHER PUBLICATIONS

Wallenberger et al., "Strong, Small Diameter, Boron Fibers by LCVD", Materials Letters, vol. 14 (1992), pp. 198-202.

(Continued)

*Primary Examiner* — David P Turocy
(74) *Attorney, Agent, or Firm* — Kevin P. Radigan, Esq.; Heslin Rothenberg Farley & Mesiti P.C.

(57) ABSTRACT

A composite tape and method of fabrication are provided which includes multiple layers and a laser-driven chemical vapor deposition (LCVD)-formed additive material in at least one layer of the multiple layers to enhance one or more properties of the composite tape. The LCVD-formed additive material is a single crystalline material and can include LCVD-formed granular material and/or LCVD-formed fiber material in the same or different layers of the composite tape to enhance, for instance, fracture strength and/or wear resistance of the composite tape.

9 Claims, 14 Drawing Sheets

FORM, USING LASER CHEMICAL VAPOR DEPOSITION (LCVD), A SELECTED ADDITIVE MATERIAL (e.g., A SELECTED LCVD FORMED FIBER MATERIAL AND/OR A SELECTED LCVD FORMED GRANULAR MATERIAL) — 100

INCORPORATING (E.G., DURING TAPE FABRICATION) THE SELECTED LCVD-FORMED ADDITIVE MATERIAL INTO ONE OR MORE CONSTITUENT LAYERS OF A TAPE, FORMING A COMPOSITE TAPE WITH ONE OR MORE ENHANCED PROPERTIES — 110

(56) References Cited

U.S. PATENT DOCUMENTS

| | | |
|---|---|---|
| 3,755,061 A | 8/1973 | Schurb |
| 3,958,406 A | 5/1976 | Corbiere |
| 4,076,380 A | 2/1978 | DiMarcello |
| 4,295,890 A | 10/1981 | Stroke |
| 4,539,248 A | 9/1985 | Brockington et al. |
| 4,588,699 A | 5/1986 | Brennan et al. |
| 4,962,070 A | 10/1990 | Sullivan |
| 5,096,739 A | 3/1992 | Strutt et al. |
| 5,134,020 A | 7/1992 | Cotteret et al. |
| 5,296,288 A | 3/1994 | Kourtides et al. |
| 5,326,731 A | 7/1994 | Bhola et al. |
| 5,342,022 A | 8/1994 | Artjushenko et al. |
| 5,399,430 A | 3/1995 | Nordine et al. |
| 5,705,122 A | 1/1998 | Curran |
| 5,786,023 A | 7/1998 | Maxwell et al. |
| 5,955,391 A | 9/1999 | Kameda et al. |
| 6,183,714 B1 | 2/2001 | Smalley et al. |
| 6,291,058 B1 | 9/2001 | Goujard et al. |
| 6,322,889 B1 | 11/2001 | Lara-Curzio et al. |
| 6,323,413 B1 | 11/2001 | Roth et al. |
| 6,446,814 B1 | 9/2002 | King |
| 6,706,400 B2 | 3/2004 | Mercuri et al. |
| 7,657,142 B2 | 2/2010 | Gasca et al. |
| 7,666,475 B2 | 2/2010 | Morrison |
| 9,206,508 B1 | 12/2015 | Hariharan et al. |
| 9,217,210 B2 | 12/2015 | Velev et al. |
| 9,896,385 B2 | 2/2018 | Harrison et al. |
| 9,938,393 B2 * | 4/2018 | Schneiter ............. C04B 35/563 |
| 10,047,015 B2 | 8/2018 | Pegna et al. |
| 10,546,661 B2 | 1/2020 | Pegna et al. |
| 10,676,391 B2 | 6/2020 | Harrison et al. |
| 10,876,227 B2 | 12/2020 | Harrison et al. |
| 2002/0085968 A1 | 7/2002 | Smalley |
| 2003/0168146 A1 | 9/2003 | Wenstrup et al. |
| 2005/0048859 A1 | 3/2005 | Canahan et al. |
| 2005/0082676 A1 | 4/2005 | Andry et al. |
| 2005/0181192 A1 | 8/2005 | Steffier |
| 2005/0247904 A1 | 11/2005 | Raj et al. |
| 2005/0255033 A1 | 11/2005 | Shimoji et al. |
| 2006/0039524 A1 | 2/2006 | Feinroth et al. |
| 2006/0115648 A1 | 6/2006 | Chen |
| 2007/0093587 A1 | 4/2007 | Shen et al. |
| 2008/0143209 A1 | 6/2008 | Tan et al. |
| 2008/0153959 A1 | 6/2008 | Charati et al. |
| 2008/0175988 A1 | 7/2008 | Chiu et al. |
| 2009/0064476 A1 | 3/2009 | Cross et al. |
| 2010/0040834 A1 | 2/2010 | Dawes et al. |
| 2010/0055352 A1 | 3/2010 | Maxwell |
| 2011/0124483 A1 | 5/2011 | Shah et al. |
| 2011/0170653 A1 | 7/2011 | Cabrero et al. |
| 2011/0274906 A1 | 11/2011 | Kim et al. |
| 2011/0286570 A1 | 11/2011 | Farmer et al. |
| 2011/0311427 A1 | 12/2011 | Hauge et al. |
| 2012/0002777 A1 | 1/2012 | Lahoda et al. |
| 2012/0076718 A1 | 3/2012 | Liu et al. |
| 2012/0135224 A1 | 5/2012 | Guzman De Villoria et al. |
| 2012/0287553 A1 | 11/2012 | Ramani et al. |
| 2012/0315467 A1 | 12/2012 | Lafdi et al. |
| 2012/0315815 A1 | 12/2012 | Fong et al. |
| 2013/0010915 A1 | 1/2013 | Gamier et al. |
| 2013/0077731 A1 | 3/2013 | Sherwood et al. |
| 2013/0093122 A1 | 4/2013 | Schultz et al. |
| 2013/0163711 A1 | 6/2013 | Zabiego et al. |
| 2013/0329849 A1 | 12/2013 | Mazaudier |
| 2014/0170919 A1 | 6/2014 | Manipatruni et al. |
| 2015/0004393 A1 | 1/2015 | Pegna et al. |
| 2016/0208412 A1 | 7/2016 | Sandgren et al. |
| 2016/0347672 A1 | 12/2016 | Harrison |
| 2017/0213604 A1 | 7/2017 | Pegna et al. |
| 2017/0326838 A1 | 11/2017 | Pegna et al. |
| 2017/0331022 A1 | 11/2017 | Pegna et al. |
| 2017/0369998 A1 | 12/2017 | Pegna et al. |
| 2018/0087157 A1 | 3/2018 | Harrison et al. |
| 2018/0087214 A1 | 3/2018 | Harrison et al. |
| 2018/0148864 A1 | 5/2018 | Harrison et al. |
| 2018/0370860 A1 | 12/2018 | Pegna et al. |
| 2019/0062222 A1 | 2/2019 | Pegna et al. |
| 2021/0087726 A1 | 3/2021 | Pegna et al. |
| 2021/0230743 A1 | 7/2021 | Harrison et al. |
| 2022/0144711 A1 | 5/2022 | Harrison et al. |

FOREIGN PATENT DOCUMENTS

| | | | |
|---|---|---|---|
| CN | 107984812 A * | 5/2018 | |
| CN | 107984812 A | 5/2018 | |
| EP | 1 209 123 A2 | 5/2002 | |
| GB | 2054542 B | 1/1983 | |
| JP | S 61-132628 A | 6/1986 | |
| JP | 62121643 A * | 6/1987 | ............ B01J 19/121 |
| JP | S 62121643 A | 6/1987 | |
| JP | H 03-285877 A | 12/1991 | |
| JP | H 07-252662 A | 3/1995 | |
| JP | H 09-268065 A | 10/1997 | |
| JP | H 10-059780 A | 3/1998 | |
| JP | 2002-211980 A | 7/2002 | |
| JP | 2005-231952 A | 9/2005 | |
| JP | 2013194073 A * | 9/2013 | ............ B32B 15/08 |
| JP | 2013194073 A | 9/2013 | |
| JP | 2013-210372 A | 10/2013 | |
| WO | WO 1988/001204 A1 | 2/1988 | |
| WO | WO 2010/090624 A1 | 8/2010 | |
| WO | WO 2012/109841 A1 | 8/2012 | |
| WO | WO 2013/180764 A1 | 12/2013 | |
| WO | WO 2014/143937 A1 | 9/2014 | |
| WO | WO 2015/112935 A1 | 7/2015 | |
| WO | WO 2015/200257 A1 | 12/2015 | |
| WO | WO 2017/197082 A1 | 11/2017 | |
| WO | WO 2017/197105 A1 | 11/2017 | |
| WO | WO 2018/064261 A1 | 4/2018 | |
| WO | WO 2018/102352 A1 | 6/2018 | |

OTHER PUBLICATIONS

Johansson et al., "Microfabrication of Three-Dimensional Boron Structures by Laser Chemical Processing", Journal of Applied Physics, vol. 72, No. 12, (1992), (8 pages).

Wallenberger, Frederick T., "Inorganic Fibres and Microfabricated Parts by Laser Assisted Chemical Vapour Deposition (LCVD): Structures and Properties", Ceramics International, vol. 23, (1997), pp. 119-126.

Maxwell et al., "Real-Time Volumetric Growth Rate Measurements and Feedback Control of Three-Dimensional Laser Chemical Vapor Deposition", Appl. Phys. A, vol. 67, No. 3, (1998), pp. 323-329.

Waku et al., "An Amorphous Ceramic A132.4Er7.6O60 Fiber with Large Viscous Flow Deformation and a High-Strength Nanocrystallized Ceramic Fiber", Journal of Materials Science, vol. 36, No. 10, (May 2001), pp. 2435-2440.

Wen et al., "Interfacial Micro structure and Reaction of BN-Coated Single Crystal Al2O3 Fiber Reinforced NiAl Matrix Composites", Journal of Materials Science, vol. 37, No. 6, (Mar. 2002), pp. 1253-1258.

Kerans et al., "High Temperature Composites", Air Force Research Laboratory Report No. AFRL-ML-WP-TP-2002-407, (Aug. 2002), (22 pages).

Kerans et al., "Interface Design for Oxidation-Resistant Ceramic Composites", Journal of the American Ceramic Society, vol. 85, No. 11, (Nov. 2002), pp. 2599-2632.

Behlau et al., "Mechanical Properties of Carbon and BN Coated SiC Fibers", Ceramic Engineering and Science Proceedings, vol. 24, No. 4, (Jan. 2003), pp. 225-230.

Chen et al., "Carbide Derived Carbon (CDC) Coatings for Tyranno ZMI SiC Fibers", Ceramic Engineering and Science Proceedings, vol. 24, No. 3, (Jan. 2003), pp. 57-62.

Chen et al., "Carbothermal Synthesis of Al—O—N Coatings Increasing Strength of SiC Fibers", International Journal of Applied Ceramic Technology, vol. 1, No. 1, Jan. 1, 2004 (pp. 68-75).

Lee et al., "Microstructure and Mechanical Properties of Al2O3/Y3Al5O12/ZrO2 Ternary Eutectic Materials", Journal of European Ceramic Society, vol. 25, No. 8, (Jan. 2005), pp. 1411-1417.

(56) References Cited

OTHER PUBLICATIONS

Maxwell et al., "Preparation of Superhard BxCy Fibers by Microvortex-Flow Hyperbaric Laser Chemical Vapor Deposition", Diamond & Related Materials, vol. 16, Issue 8, (Jan. 2007), pp. 1557-1564.

Longtin et al., "Synthesis of Carbon Nanofiber Films and Nanofiber Composite Coatings by Laser-Assisted Catalytic Chemical Vapor Deposition", Thin Solid Films, vol. 515, No. 5, (2007) pp. 2958-2964.

Longtin et al., "Selective Area Synthesis of Aligned Carbon Nanofibers by Laser-Assisted Catalytic Chemical Vapor Deposition", Diamond & Related Materials, vol. 16 (2007) pp. 1541-1549.

Liao et al., "Large-Scale Aligned Silicon Carbonitride Nanotube Arrays: Synthesis, Characterization, and Field Emission Property", Journal of Applied Physics, vol. 101, No. 11, (Jun. 2007), pp. 114306.1-114306.4.

Hu et al., "Oxidation Behavior of Zirconium Diboride-Silicon Carbide at 1800° C.", Scripta Materialia, vol. 57, No. 9, (Nov. 2007), pp. 825-828.

Marsh, John, "Quantum Well Intermixing Revolutionizes High Power Laser Diodes", Diodenlaser, Laser Technik Journal, vol. 4, No. 5, DOI: 10.1002/latj.200790190 (Nov. 2007) (4 pages).

Liu et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, (Oct. 2008), pp. 3670-3672.

Jouanny et al., "Study of TiC Coatings on Nicalon Fibre Prepared by Pressure-Pulsed Reactive Chemical Vapour Deposition at Low Pressure", ECS Translations, vol. 25, No. 8, (Jan. 2009), pp. 1267-1272.

Roy et al., "Atomic Layer Deposition of Alumina Onto Carbon Fibers", Journal of the American Ceramic Society, vol. 94, No. 7, (Jul. 2011), pp. 2014-2022.

Zhang et al., "Ferromagnetism Induced by Intrinsic Defects and Boron Substitution in Single-Wall SiC Nanotubes", Journal of Physical Chemistry, vol. 115, No. 35, (Sep. 2011), pp. 9987-9992.

Gan, Yong X., "Structural Assessment of Nanocomposites", Micron, vol. 43, Issue 7, (2012) pp. 782-817.

Ares et al. "Columnar-to-Equiaxed Transition in Metal-Matrix Composites Reinforced with Silicon Carbide Particles", Hindawi Publishing Corporation, Journal of Metallurgy, vol. 2013, Article ID 628495, 12 pages.

Glazoff et al., "Morphological Analysis of Zirconium Nuclear Fuel Rods Braided with SiC: Quality Assurance and Defect Identification", Journal of Nuclear Materials, vol. 451, Issues 1-3, (Apr. 2014), pp. 216-224.

Wang, Mengxiao, M.S., "UV Laser-Assisted Diamond Deposition", The Graduate College at the University of Nebraska, (Nov. 2014), (100 pages), http://digitalcommons.uni.edu/cgi/viewcontent.cgi?article=1068&context=elecengtheses.

Luo et al., "Microstructure, Tensile Strength and Thermostability of W-core SiC Fibers With or Without Carbon Coating", Materials Science & Engineering: A, vol. 647, (2015), pp. 265-276.

Wang et al., "Synthesis of ZrC—SiC Powders from Hybrid Liquid Precursors with Improved Oxidation Resistance", Journal of the American Ceramic Society, vol. 98, No. 1, (Jan. 2015), pp. 197-204.

Jiang et al., "Fabrication of Barium-Strontium Aluminosilicate Coatings on C/SiC Composites via Laser Cladding", Journal of Materials Science & Technology, vol. 33, No. 2, (2017), pp. 166-171.

Zimmerman et al. "Fragmentation-Driven Grain Refinement in Directional Solidification of AlCu10wit-% Alloy at Low Pulling Speeds", Acta Materialia, vol. 126, (2017) pp. 236-250.

Harrison et al., "International Search Report" for PCT/US2021/14857, dated Apr. 8, 2021 (2 pages).

Tanaka, Hidehiko, "Silicon Carbide Powder and Sintered Materials", Journal of the Ceramic Society of Japan, vol. 119, Issue 3, pp. 218-233 (Year: 2011).

* cited by examiner

COMPOSITE TAPE WITH LCVD-FORMED ADDITIVE MATERIAL IN CONSTITUENT LAYER(S)

CROSS-REFERENCE TO RELATED APPLICATIONS

This application is related to the following patent applications, each of which is hereby incorporated herein by reference in its entirety: U.S. Patent Application Ser. No. 63/072,333, filed Aug. 31, 2020, entitled "High Performance Tape"; U.S. Pat. No. 10,047,015 B2, which issued on Aug. 24, 2018, entitled "High Strength Ceramic Fibers and Methods of Fabrication"; PCT Publication No. WO 2013/180764 A1, which published Dec. 5, 2013, entitled "High Strength Ceramic Fibers and Methods of Fabrication"; U.S. Patent Publication No. 2017/0331022 A1, which published Nov. 16, 2017, entitled "Multilayer Functional Fiber and Method of Making"; PCT Publication No. WO 2017/197105 A1, which published Nov. 16, 2017, entitled "Multilayer Functional Fiber and Method of Making"; U.S. Patent Publication No. 2017/326838 A1, which published Nov. 16, 2017, entitled "Fiber Delivery Assembly and Method of Making"; PCT Publication No. WO 2017/197082 A1, which published Nov. 16, 2017, entitled "Fiber Delivery Assembly and Method of Making"; PCT Publication No. WO 2015/0012822 A1, which published Jul. 30, 2015, entitled "Contiguously Blended Nano-Scaled Multi-Phase Fibers"; PCT Publication No. WO 2018/064261 A1, which published Apr. 5, 2018, entitled "Multi-Composition Fiber with Refractory Additive(s) and Method of Making"; PCT Publication No. WO 2018/102352 A1, which published on Jun. 7, 2018, entitled "Fiber With Elemental Additive(s) and Method of Making"; U.S. Patent Publication No. 2018/0370860 A1, which published Dec. 27, 2018, entitled "Functional High-Performance Fiber Structure"; U.S. Patent Application Ser. No. 62/966,157, filed Jan. 27, 2020, entitled "High Purity Fiber Feedstock for Loose Grain Production"; and U.S. patent application Ser. No. 16/938,072, filed Jul. 24, 2020, entitled "Non-Woven Micro-Trellis Fabrics and Composite or Hybrid-Composite Materials Reinforced Therewith".

BACKGROUND

There are a wide variety of tape products available including, for instance, adhesive tape, duct tape, electrical tape, filament tape, gaffer tape, heat tape, masking tape, pressure-sensitive tape, etc., which are typically a combination of a backing material and an adhesive in different layers of the tape. Tapes can be used in many situations, including to bond or join objects, and to protect a surface area. Tapes, such as adhesive tapes, typically include a material referred to as a backing or carrier layer, which is coated with an adhesive layer, and a release liner, if needed. Tape is typically wound in the form of a long roll, and then slit into narrower-width bands to produce several rolls of tape.

SUMMARY

Certain shortcomings of the prior art are addressed, and additional advantages are provided by the present invention, which in one aspect includes a composite tape having multiple layers, with a laser-driven chemical vapor deposition (LCVD)-formed additive material being in at least one layer of the multiple layers to enhance one or more material properties of the composite tape. The LCVD-formed additive material is a single nanocrystalline material, and advantageously, LCVD-formed additive material is a pure material (such as discussed herein), which can be provided in the form of fibers and/or powder for incorporation into one or more layers of the composite tape.

For instance, in one or more embodiments, the LCVD-formed additive material in the at least one layer of the multiple layers includes a ceramic granular material (i.e., powder), where the ceramic granular material is selected to enhance fracture strength and wear resistance of the composite tape. In one embodiment, the ceramic granular material is a range of 10-60 percent volume fraction of the at least one layer of the multiple layers.

In one or more other implementations, the LCVD-formed additive material in the at least one layer of the multiple layers includes a ceramic fiber material, where the ceramic fiber material enhances wear resistance of the composite tape. In one embodiment, the ceramic fiber material is in a range of 20-50 percent volume fraction of the at least one layer of the multiple layers.

In one or more implementations, the LCVD-formed additive material in the at least one layer of the multiple layers includes both a ceramic fiber material and a ceramic granular material to enhance fracture strength and wear resistance of the composite tape. In one embodiment, the LCVD-formed additive material in in a range of 10-60 percent volume fraction of the at least one layer of the multiple layers.

In one or more implementations, the LCVD-formed additive material includes a nanocrystalline carbide material. For instance, the nanocrystalline carbide material includes a carbide granular material or a carbide fiber material. In one implementation, the nanocrystalline carbide material includes one or more of silicon carbide (SiC), boron carbide ($B_xC_{x-1}$), or tungsten carbide (WC).

In one or more other embodiments, a method of fabricating a composite tape is provided. The method includes using, at least in part, laser-driven chemical vapor deposition (LCVD) to form an LCVD-formed additive material, with the LCVD-formed additive material being a single nanocrystalline material which is at least one of a fiber material or a granular material. Further, the method includes producing the composite tape, where the producing includes providing the LCVD-formed additive material in at least one layer of the multiple layers of the composite tape to enhance one or more properties of the composite tape.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages and details thereof, are explained more fully below with reference to the non-limiting example(s) illustrated in the accompanying drawings. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that, numerous inventive aspects and features are disclosed herein, and unless inconsistent, each disclosed aspect or feature is combinable with any other disclosed aspect or feature as desired for a particular application.

Today's tapes are engineered products with countless uses and versions containing various constituent layers to meet different application demands and expectations. Advantageously, disclosed herein are enhanced engineered tape products, wherein enhanced tape performance is obtained by including an additive material in one or more constituent layers to form a composite tape. In each instance, the additive material is a laser-driven chemical vapor deposition (LCVD)-formed additive material disposed within one or more layers of the composite tape. For instance, as explained herein, a selected additive material can be incorporated into a backing layer, another non-adhesive layer of the tape, and/or into an adhesive layer of the tape. Further, the additive material can be incorporated in the form of loose or aligned fibers or a granular material (e.g., a powder) depending on the application. A variety of specific LCVD-formed fibers are possible, such as an LCVD-produced ceramic material, or carbide material. In one or more implementations, the LCVD-produced carbide material can include one or more of silicon carbide (SiC), boron carbide ($B_xC_{x-1}$), or tungsten carbide (WC). These carbide materials have some of the highest hardness values in nature, providing outstanding wear and impact resistance. In addition, silicon carbide, boron carbide, and tungsten carbide are refractory-grade, meaning that they are viable materials at extremely high temperatures, normally greater than 1200° C. (2200° F.). The carbides in bulk form typically find use as armor plates for personal and vehicle protection, wear and grinding media, and cutting tools.

Figure 1:
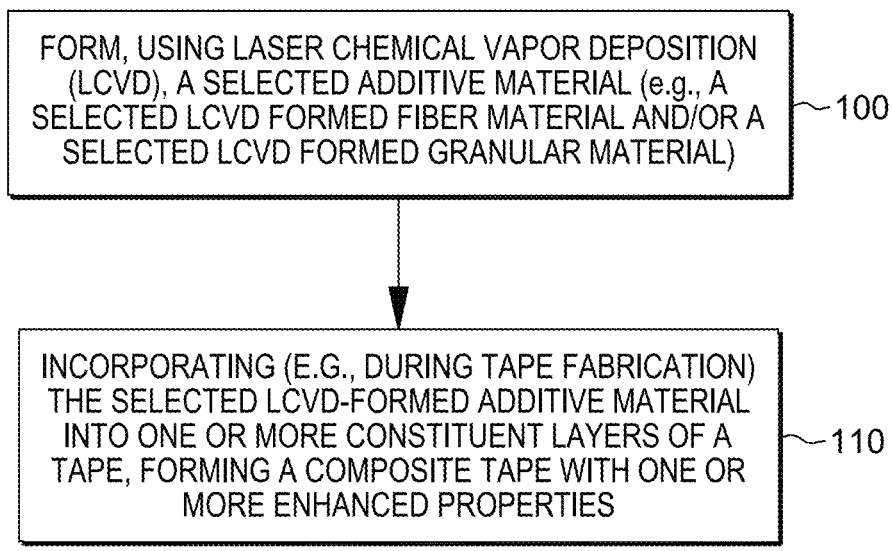
FIG. 1 depicts one embodiment of a workflow illustrating certain aspects of one or more embodiments of the present invention.

FIG. 1 depicts one embodiment of a workflow illustrating certain aspects of one or more embodiments of the present invention. As illustrated, in one or more embodiments, laser chemical vapor deposition (LCVD) is used to form a selected additive material, such as a selected LCVD-formed fiber material and/or a selected LCVD-formed granular material 100. The selected material is a substantially pure, single nanocrystalline material which is incorporated during tape fabrication into one or more constituent layers of the tape to form a composite tape 110. The additive material percent volume in a layer, as well as the selected material format (that is, whether fiber and/or granular material) can be chosen for a particular application to achieve the desired composite tape characteristics.

As described herein, specific ceramic chemical compositions can be formed by laser-driven chemical vapor deposition (LCVD) into fiber or powder (i.e., granular) formats. Products made by an LCVD process possess significant material property and performance advantages over equivalent materials manufactured from other more traditional approaches, such as the Acheson process for silicon carbide powder and the Yajima process for silicon carbide fibers. One of the most important features of LCVD-fabricated material is the lack of contaminants present. Only the elements delivered by the gas precursors are deposited, and so control of these inputs is a significant consideration. For non-oxide fiber products such as carbides and diborides, this translates to no oxygen present and is important for preventing oxidation degradation at elevated temperature exposures which ultimately negatively impacts performance. All three high hardness carbide materials (discussed herein) produced by LCVD in the powder or fiber form can serve as additives to adhesive tape formulations in order to greatly enhance the mechanical properties in the tape, particularly those that are driven by the characteristic high hardness and fracture strength. In this manner, a high performance composite tape product is achieved through (for instance) the addition of a carbide composition in powder or fiber format, which is capable of withstanding challenging wear applications. The tape can be applied on essentially any desired surface to decrease the rate of wear loss. The choice of additive format, granular or fiber, can be driven by the needs of the application. For instance, fibers included in the engineered design of the tape in a loose, random orientation or in a nonwoven matte architecture can provide an improvement in the fracture toughness (in other words, ductility or energy absorption capacity) because of the high aspect ratio.

An example application for a wear-resistant carbide reinforced tape is on the leading edges of the rotor blades on helicopters that are operating in aggressive environments, such as hot, sandy desert locations. The carbide tape would serve to reduce particle impingement wear abrasion by silica particles (sand) on the metal surfaces of the rotor that can also experience temperatures of several hundred degrees Fahrenheit between the hot air and the drag and resistance to the rotation of the blades. This combination of hardness and high temperature capability cannot be achieved with any hydrocarbon-based material additives. For this example, weight is an important consideration in terms of keeping the aerodynamic balance and operation of the rotor blades; as such, silicon carbide or boron carbide would be the preferred LCVD-based additive material over tungsten carbide because of the differences in weight, which is represented by the characteristic material densities (for SiC, 3.21 grams/cubic centimeter or g/cc; for $B_4C$, 2.52 g/cc; and for WC, 15.63 g/cc).

As noted, a tape can be made up of an adhesive layer applied to a backing or carrier layer. The carrier layer can be of a wide range of starting materials. The most common type of materials used are based on polymers (plastics), such as PET (polyethylene terephthalate), polyester, polyimide, PVC (polyvinyl chloride), and acrylic (like polymethyl methacrylate or PMMA), which are typically formed into the carrier layer as a thin film. Other carrier materials used include silicone, cloth, and paper.

The LCVD-based powders and/or fibers discussed herein can be added in the production stage of the carrier layer. For instance, in one embodiment, the polymer-based carriers are prepared into a thin film by melting of the raw materials (usually in a pellet format) in an industrial vat, into which the powder and/or fiber additives would also be mixed. The melt is then injected through a wide slit of a desired opening while being cooled in order to form the film. In the case of a paper-based carrier layer embodiment, the LCVD additives would be dosed into the fibrous mix of the pulp stage before being thinly rolled.

As a further enhancement to tape performance, the LCVD powder and/or fiber could also be added to the adhesive material as it is mixed in preparation for application to the formed carrier layer. The carrier layer roll is typically passed across a supply of the adhesive in order to transfer the sticky material to the carrier underside. In this manner, additional powder or fiber can be loaded into the composite tape structure.

The LCVD-formed additives discussed herein can be included separately, or together, meaning that the tape could have only LCVD-formed granular material or powder added, only LCVD-formed fibers added, or both LCVD-formed powders and fibers added together into the tape formulation. The combined powder plus fibers composition can be chosen in order to optimize the packing and dispersion of the additives in the tape formulation (homogenization of the additives throughout the tape), while enhancing mechanical properties, such as the toughness/resiliency of the composite tape, through the included fiber/powder architecture.

In one or more embodiments, to achieve meaningful impact on the material properties of the composite tape, the minimum addition of either powder form or fiber from singularly would be in the 10-15 percent volume fraction with, for instance, a maximum of 50 percent volume fraction. If including both forms of additives to a tape formulation, the combined quantity of powder and fiber can be, for instance, up to about 60 percent volume fraction.

By way of further detail, FIGS. 2-12 describe embodiments of forming, using laser chemical vapor deposition (LCVD) one or more selected additive materials (e.g., a selected LCVD-formed fiber material and/or a selected LCVD-formed granular material), which can be incorporated into a composite tape as described herein. FIG. 13 illustrates further details of one embodiment of incorporating one or more selected additive materials into one or more constituent layers of a tape to form a composite tape, as described herein.

Referring first to FIGS. 2-12, in one aspect, a method and apparatus are presented for forming a plurality of fibers from precursors, including a reactor adapted to grow a plurality of individual fibers; and a plurality of independently controllable lasers, each laser of the plurality of lasers growing a respective fiber of the plurality of fibers. The reactor and lasers may grow the fibers according to laser-induced chemical vapor deposition (LCVD). The plurality of lasers in one embodiment include quantum well intermixing (QWI) lasers.

In another aspect, a method is presented of forming a high purity granular material, including providing precursors in a reactor; forming at least part of a fiber in the reactor from the precursors using chemical deposition interacting with said precursors; and forming the granular material from the fiber. In one aspect, the chemical deposition may include laser induced chemical vapor deposition. The granular material may be formed by grinding or milling the fiber into the granular material, e.g., ball milling the fiber.

In a further aspect, a plurality of fibers can be formed in parallel using a single laser beam, or multiple laser beams that have independent power control, or multiple laser beams that do not have independent power control. At least one element may be added during the chemical deposition, which serves as a free oxygen getter to improve the oxidation resistance of the granular material; and the granular material can be specially shaped and/or coated.

One of the most common formats for using SiC is in powder form over a range of particle sizes, from several millimeters in diameter down to less than one micron. The manufacturing approach that has been utilized for over 125 years is the Acheson process, in which a reactor 'bath' (or furnace) of silica (or sand) and powderized coke (carbon) raw materials are mixed together. High voltage current is supplied to the silica-coke mixture through inserted electrodes, creating a carbothermal reaction between the two constituents that reaches temperatures of 2000 C and greater. The resulting reaction product is an alpha crystalline phase SiC material. Alpha phase SiC is a hexagonal crystalline structure, with two dimension layering like graphite. As a result, the hardness and strength properties are inferior to those found for the beta phase SiC, which is a three dimensional face-centered cubic structure. The beta form of SiC is preferable because of its improved mechanical performance. In order to fabricate beta SiC, the alpha SiC feedstock material must go through a conversion process in high temperature furnaces that can operate for long periods at temperatures ranging from 1700 to 2000 C. Beta SiC powder manufacturers rely on this heat treatment approach, but it suffers from several limitations that affect the performance of the powder in end use applications. These include: (i) conversion percentage of alpha to beta, which is typically in the 80% range but rarely in the 90% or greater regime, (ii) oxygen contamination, which is desired to be below 1% in order to minimize the deleterious effects of oxidation attack, and (iii) manufacturing consistency in terms of both issues (i) and (ii) as well as other considerations like free carbon present. These limitations arise from process variations inherent in the heat treatment conversion process, which include varying quality of the alpha feedstock and instabilities in the furnace control parameters.

Even with these production issues, beta SiC powder is a sought-after material for a range of advanced technologies. Two examples of industrial applications of beta SiC powder are part of ceramic matrix composite (CMC) technology in the aviation/aerospace industry and the additive manufacturing (AM) field. Both applications may require beta SiC for the enhanced mechanical behavior over more readily available alpha SiC powder. In aviation CMC fabrication, beta SiC powder is added as a filler material during the matrix formation steps in order to fill volume and ultimately reduce the porosity (unfilled space) in the final component part cross-section. AM processing uses the powder as the primary constituent material, delivered via the manufacturer's proprietary slurry system. Both high technology applications are emerging from laboratory and pilot scale production to true industrial scale volumes in order to satisfy increasing performance demands.

In accordance with the above-incorporated U.S. and international patent applications, laser-driven chemical vapor deposition (LCVD) is a demonstrated approach for forming high performance fibers. The core concept is the introduction of a single laser beam or, in one embodiment, a multiple beam array into an enclosed chamber or reactor that contains a desired mixture of precursor gases. The laser beam(s) intersect with a substrate surface or other seed material to initiate the gas-phase reaction which yields a solid product (e.g., fiber) of the desired chemistry and crystallinity. The fiber format can be produced as the substrate is pulled away and the reaction product is continuously and additively formed on the material previously deposited. The LCVD process yields a range of advantages, including (i) high deposition rates on the order of hundreds of microns per second, (ii) very high purity deposited material with no undesired contaminants like free oxygen, (iii) high crystalline phase purity, and (iv) the potential for mass parallelization of fiber production using multiple laser beam LCVD as disclosed in the above-incorporated patent applications.

In accordance with an aspect of the present invention, granular materials, such as SiC powders, are produced using the intermediate step of first producing SiC fibers, and then processing the fibers into a granular, e.g., powder form. The resultant powder retains all of the advantages of the LCVD-formed fibers, including but not limited to, high chemical and phase purity, and low contamination. Moreover, the high speed and scale-ability of the LCVD production of multiple fibers in parallel can be leveraged to increase the speed and quantities of powder produced.

Therefore, in accordance with the present invention, all advantages hold true for fiber production and powder production that is based on an intermediate LCVD fiber fabrication process, several examples of which (FLP and FFG) are first presented here.

LCVD Example—Fiber Laser Printer™ (FLP)

The FLP offers an extremely versatile approach to the production of inorganic filaments. It is nearly independent of the fiber's material; a rare property among manufacturing processes, which is referred to as "Material-Agnostic". For example, the FLP has been applied to the demonstration of filaments for which no other manufacturing method is known: boron carbide; boron; tungsten carbide (with exceptional hardness of 27-29 GPa); and tertiary Si—C—B fibers (with exceptional tensile strength of 9 GPa). The assignee has demonstrated that it was possible to produce fibers with varying composition functionally graded along their axis. As further demonstration of the material-agnostic qualities of the FLP, the assignee demonstrated that it is possible to vary fiber composition and the radial distribution of microstructure. For example, the assignee has demonstrated the ability to customize SiCf microstructure distribution, with distributions ranging from (i) elongated anisotropic grains at the fiber center morphing into equiaxed fine grains at the fibers edge to (ii) uniform microstructure across the fiber. These unique characteristics contribute to the superior materials properties found in LCVD-produced fibers, such as the excellent creep resistance exhibited by the assignee's laser printed SiCf.

The assignee has also demonstrated that fibers can be coated in the FLP as fibers are being produced; a first in the industry. Interphases of Boron Nitride or Pyrolytic Carbon (PyC), with an added SiC overcoat have been deposited. Such coatings were shown feasible within a large dimensional window ranging from 10's of nanometers (nm) to ~10 µm. This is a valuable feature of the FLP as (i) interphase coating is required for the material to exhibit composite behavior; and (ii) there still are no satisfactory solutions to produce a uniform pre-coating of fibers in tows and fabrics. The current state of the art with commercial SiCf tows (HNS, SA3) consists of depositing an interphase, just prior to matrix infiltration; a cumbersome and onerous process that yields many defects.

The FLP also exhibits unparalleled flexibility in the geometric realm as well. As part of a DOE-funded effort, the assignee has demonstrated that diameter can be controlled at will during fiber growth, leading to the first demonstration of variable diameter SiCf.

Figure 2:
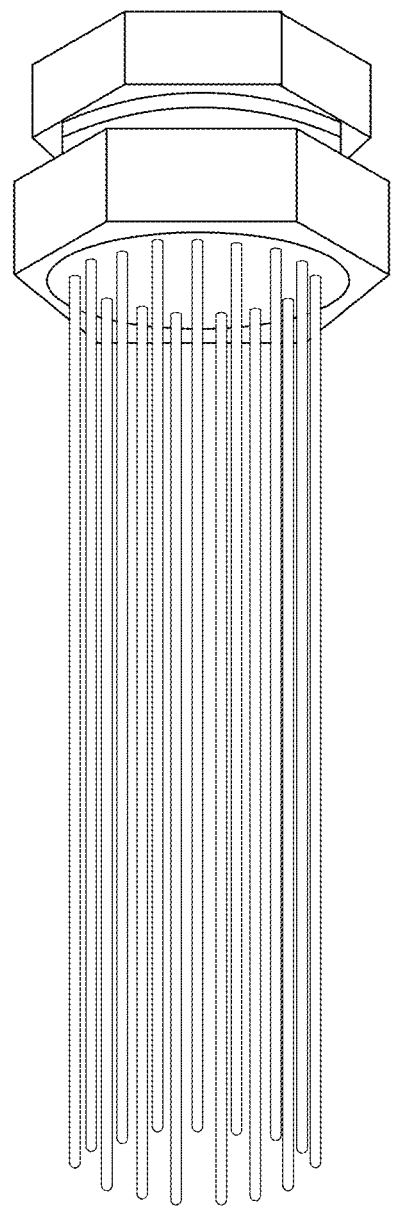
FIG. 2 is a schematic representation of a spinneret, a plate with a pattern of tiny holes through which a liquid precursor is fed, and upon exit, the stream pattern gels into filaments called "green fibers"

In most cases in the prior art, fiber formation is accomplished by passing a liquid precursor through a spinneret. For example, FIG. 2 is a schematic representation of a spinneret, a plate with a pattern of tiny holes through which a liquid precursor is fed. Upon exit, the stream pattern gels into filaments called "green fibers". This prior art, however, assumes that the fiber material can exist in either a liquid, gel, or plastic form that lends itself to flowing through a small opening. In many instances, and especially for refractory materials, such a liquid or near liquid state does not exist. It has been concluded, therefore, that when a spinneret is incompatible with the fiber material properties, a better approach involves extracting fiber out of a laser focus where the fiber is created from surrounding fluid precursors, which is not possible using the spinneret of FIG. 2. A laser is focused on the fiber tip thereby heating the fiber to temperatures at which the precursors dissociate and Chemical Vapor Deposition (CVD) takes place. The fiber grows in length and is pulled out of the reaction zone at the growth rate, resulting in the creation of an arbitrarily long monofilament fiber. This process technology, according to embodiments of the current invention, is illustrated by FIG. 3.

Figure 3:
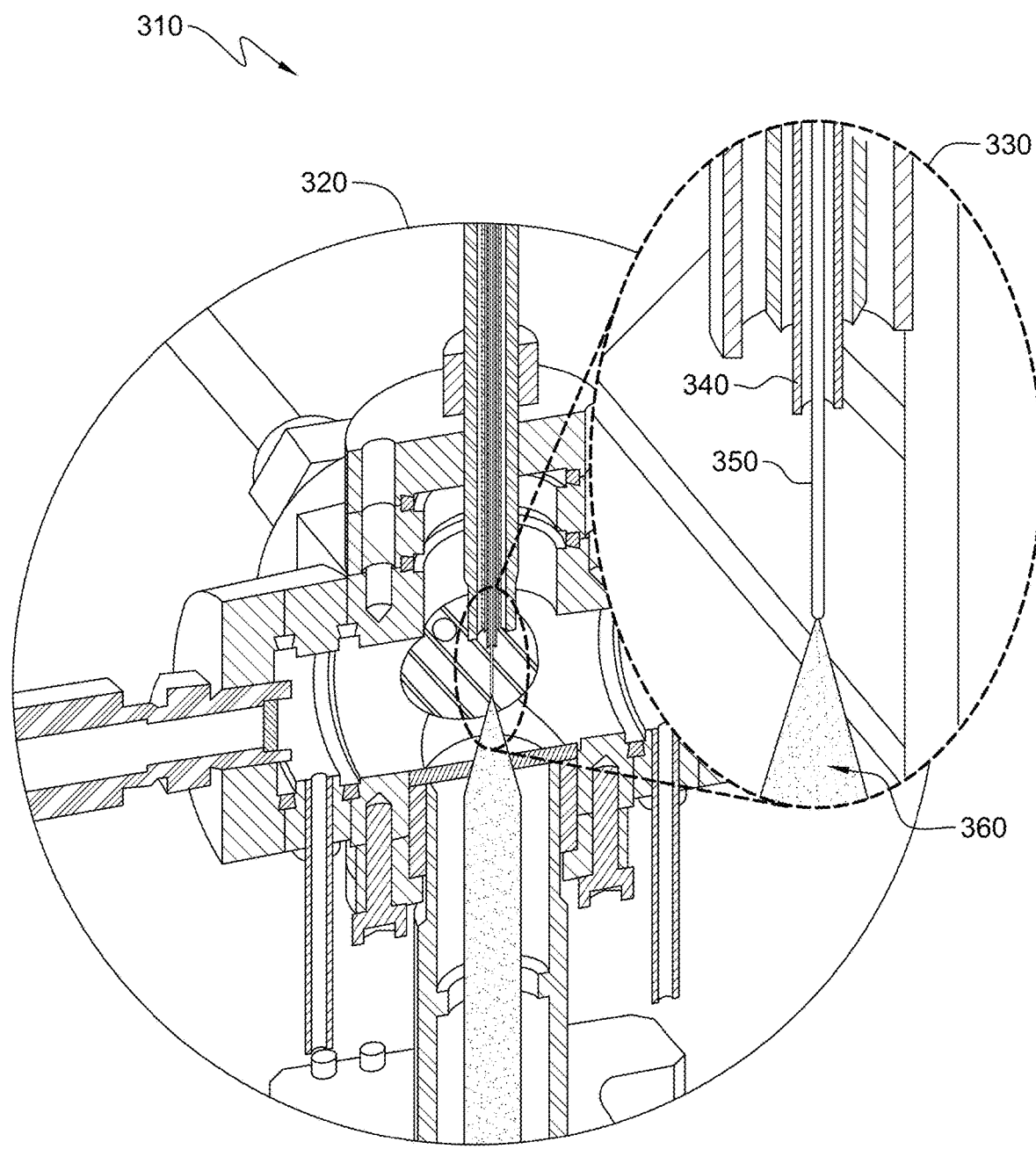
FIG. 3 is a schematic view of an exemplary process for forming a monofilament fiber.

FIG. 3 is a schematic of an exemplary process as follows including a reactor 310; enlarged cutout view of reactor chamber 320; enlarged view of growth region 330. A self-seeded fiber 350 grows towards an oncoming coaxial laser 360 and is extracted through an extrusion microtube 340. CVD precursors are injected into the reaction zone from the extrusion microtube forming a small high concentration plume around the reaction zone that feeds and convectively enhances growth. This plume is embedded in a coaxial flow of inert gas that shields the reaction and carries away diluted by-products. This reactor design builds upon understanding of Laser Induced Chemical Vapor Deposition (LCVD) fiber growth. It provides a unique and valuable materials science laboratory, suited for rapid experimental development of specialty filaments. It may be, however, unfit for large scale manufacturing.

As in the microelectronics fabrication industry, where features are massively replicated using optical (photolithographic) methods, large scale replication of fiber growth is herein disclosed. Pure optical parallelization for fiber growth is one approach to mass production of fibers. For example, a parallelization of the process technology illustrated by FIG. 3 can be pursued.

Figure 4:
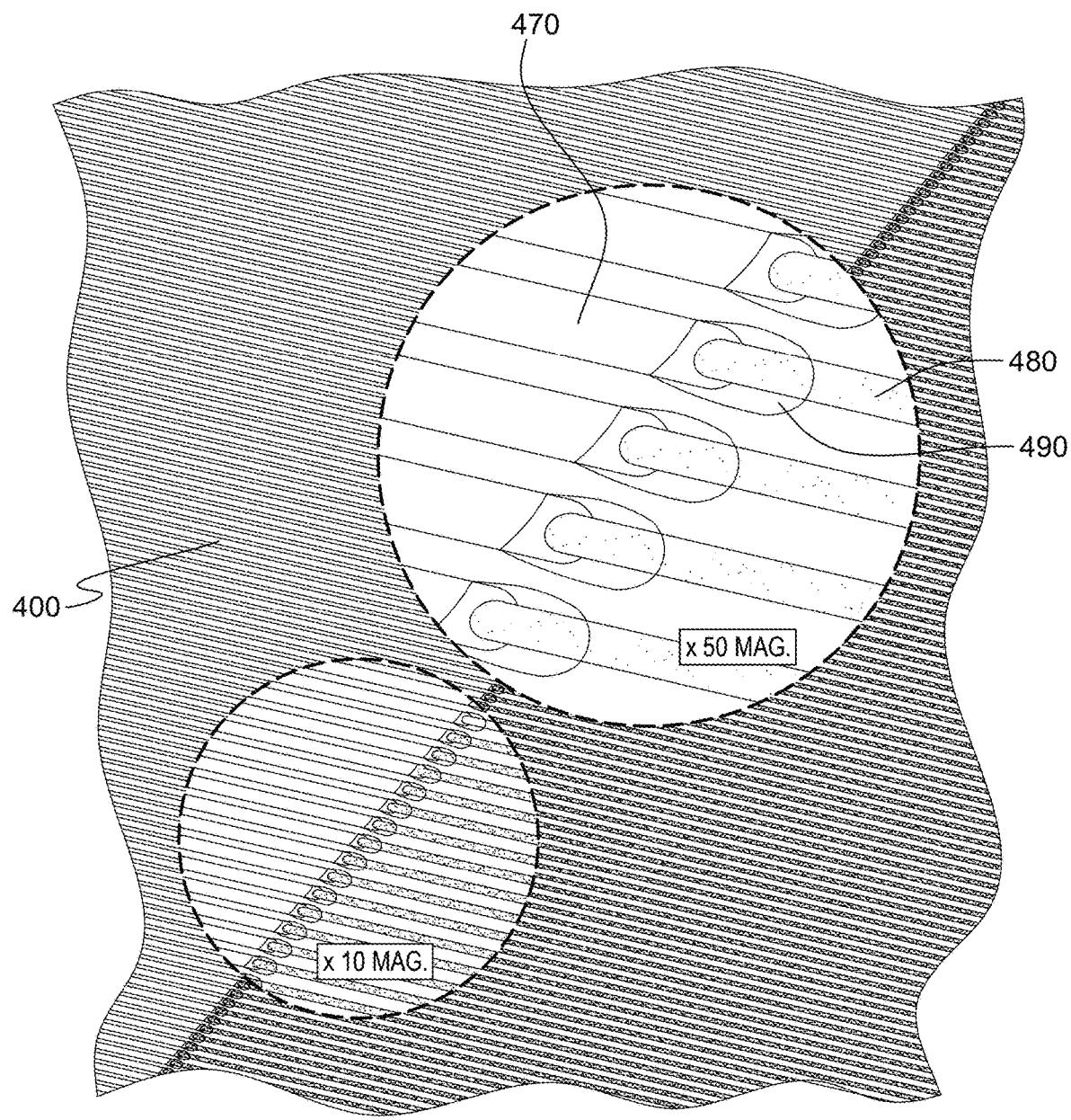
FIG. 4 is a schematic view showing how, in accordance with the present invention, fiber LCVD is massively parallelized by multiplication of the laser beams.

The present invention, in one embodiment, can involve the use of a large array of independently controlled lasers, growing an equally large array of fibers 480 in parallel, as illustrated in FIG. 4, showing how fiber LCVD can be massively parallelized from a filament lattice 400 by multiplication of the laser beams 470 inducing a plasma 490 around the tip of each fiber 480. In embodiments of the current invention, the large array of fibers 480 can be directed toward a substrate, growing standing fibers in a large array directly on a substrate, and controlling the environment at the tip of the laser to control the material system, and change the material system, of the fibers.

Using a Computer to Plate (CtP) (e.g., Quantum Well Intermixing (QWI)) laser array for LCVD is a scientific first, and so was the use of a shallow depth of focus. It provides very beneficial results. Sample carbon fibers, such as those shown in FIG. 4, were grown in parallel. FIG. 4 shows parallel LCVD growth of carbon fibers using a unit with multiple lasers, for instance 64 or more. Left: Fibers during growth. Right: Resulting free standing fibers 10-12 μm in diameter and about 5 mm long.

In all prior approaches the beam was focused to a diffraction limited spot with long Raleigh range. In accordance with the present invention, not only is the focus intense enough to sustain CVD, but the shallow depth of field means that fibers could only grow in a small region in the front and back of the image plane. This goes against commonly accepted practice in LCVD where long depths of field are favored to maximize the growth region. The advantage of a shallow depth of field is important because of the level of control it could afford. For example, if one fiber stopped growing for any reason, the focus can be moved back to that fiber tip. All other growths would stop and then restart as the lagging fiber was pulled back to the same level as the others.

Figure 5:
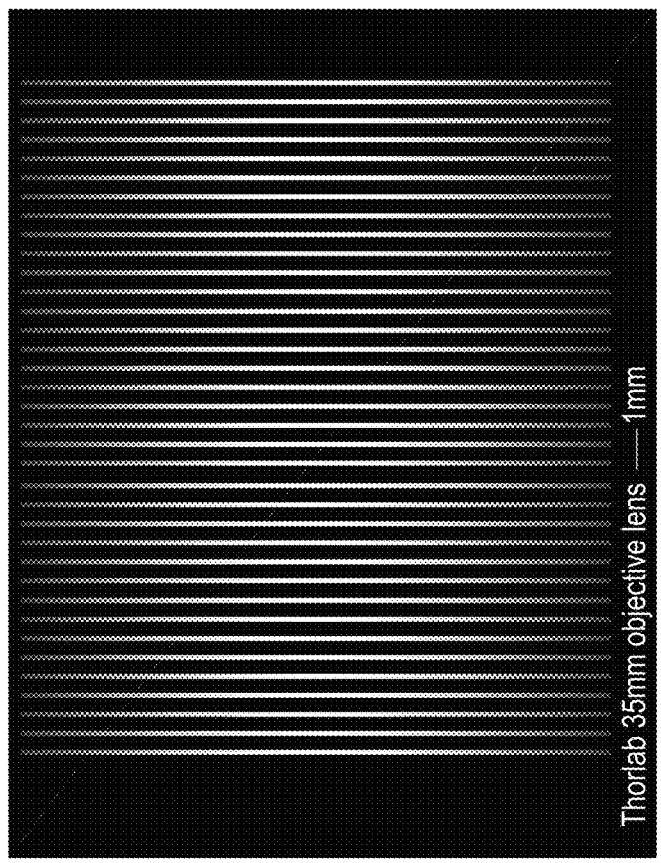
FIG. 5 shows parallel LCVD growth of carbon fibers using a module including 64 individually controlled laser emitters, in accordance with the present invention.
Figure 5:
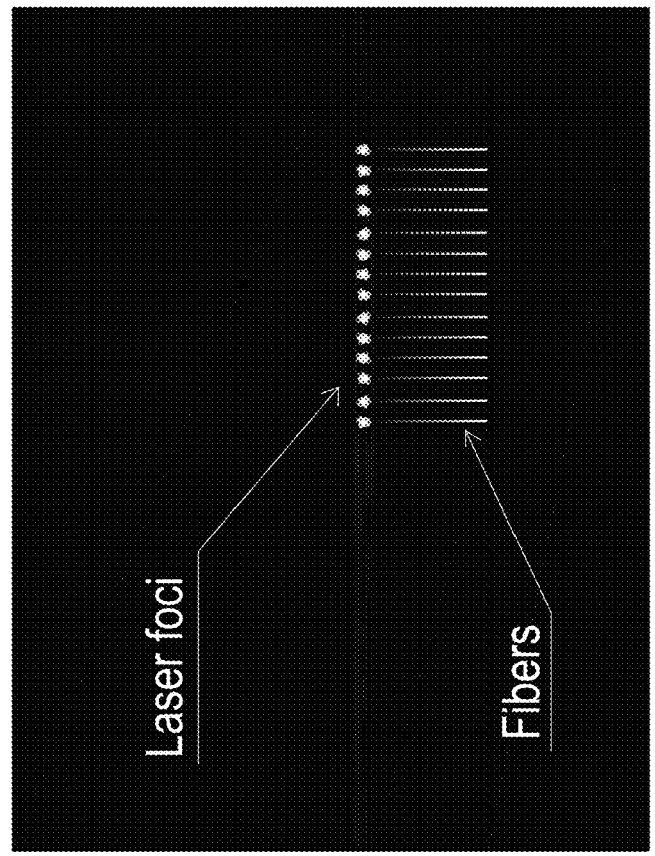

The effect of a shallow depth of focus according to some embodiments of the invention, is illustrated in FIG. 5. The uneven focus-to-focus power distribution of diffraction gratings combined with the long depth of focus of diffraction limited optics prevents any control over the position of the growth front in previous fiber arrays. A major benefit is evident in FIG. 5. Fibers are grown in unison, and to the same height. This was an unexpected benefit of source imaging over diffraction limited optics because the depth of focus is 5 to 30 times (vertical and horizontal respectively) shallower than the Rayleigh range of an equivalent diffraction limited focus. This turns out to be a huge advantage as fibers quickly grow in and out of focus. This makes it possible to track fiber growth, and even backtrack to retrieve fibers that stopped growing without affecting any of the other already grown fibers. This unique feature of the CtP laser bars is expected to represent a major advantage in controlling future parallel LCVD growth for fiber arrays.

LCVD Example—Fiber Forest Generator (FFG)

Utilizing any of the above embodiments, fibers can also be grown on a substrate using LCVD. In fact, fibers need not be continuous either. Massive arrays of short composite fibers can be derived by parallel deposition onto a base wafer using a reactor according to embodiments detailed above. A fiber array of fibers as illustrated in FIG. 5 can be printed, in some embodiments simultaneously, in order to model an array of these fiber which are implementable in fuel pellet, in some cases directly.

Figure 6:
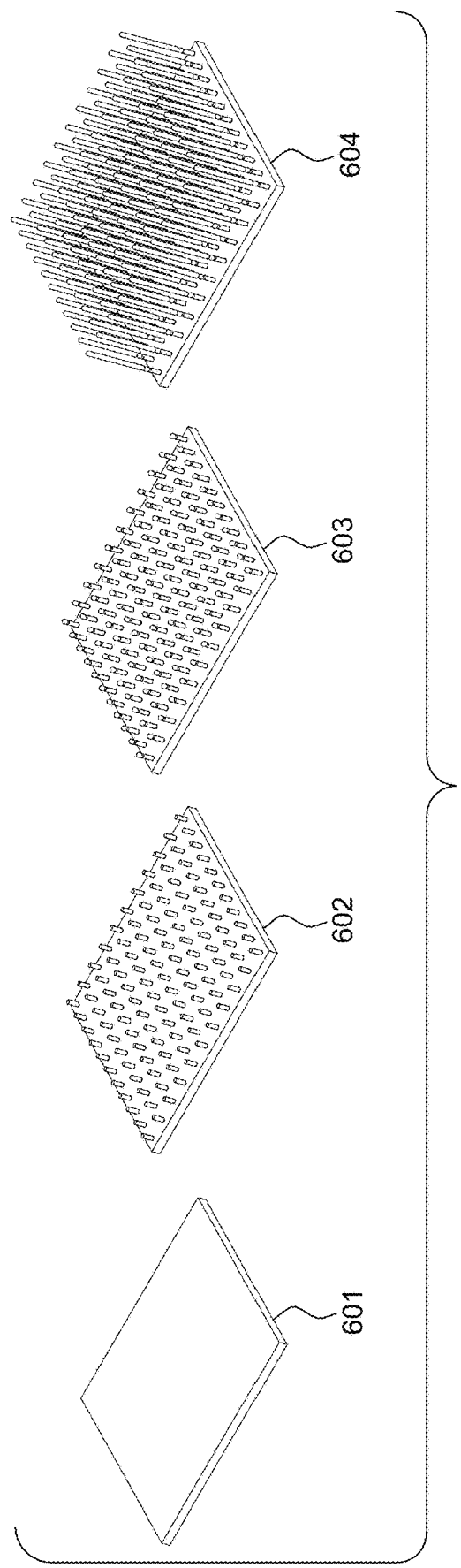
FIG. 6 illustrates a process for forming a rectangular array of fibers, in accordance with one or more aspects of the present invention.

FIG. 6 illustrates a method, according to some embodiments, of the process steps on, for instance, a square sub-section of a circular wafer, with a diameter approximately which may include, in some embodiments, a diameter of 10-15 mm. For clarity, the length scales as shown perpendicular to the wafer have been shrunk according to some embodiments. In step 601, a substrate is provided. The substrate can include a wafer substrate which may be made of a refractory, oxidation resistant, material such as SiC, ZrC, or BeO, or it may include a glass ceramic such as BMAS, BSAS, or Zirconium Silicate. In some embodiments, the substrate is not a flat surface, although not illustrated, and can include fibers previously formed according to embodiments herein described, or any solid surface. In some embodiments, at step 602, an optional array of pedestal fibers, in one or more embodiments of a refractory material such as C or SiC, are grown upon the substrate. At step 603, a first set of short fibers, are grown on the pedestals, or the substrate if no pedestals are present. At step 604, long fibers are grown on the first set of short fibers.

Figure 7A:
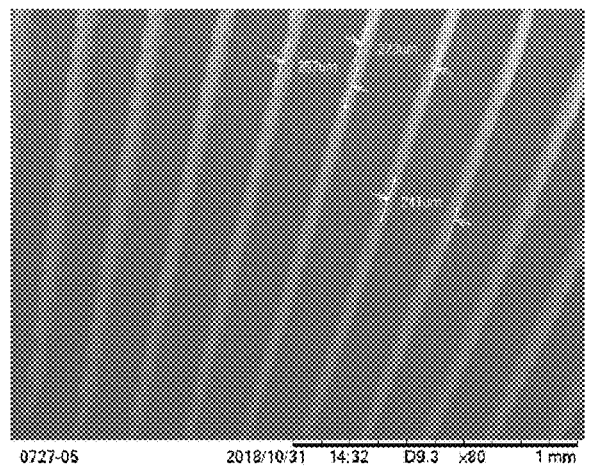
FIGS. 7A-C are SEM images of a large array of SiC fiber forests on an exemplary glassy carbon substrate at increasing magnifications, respectively, in accordance with one or more aspects of the present invention.
Figure 7B:
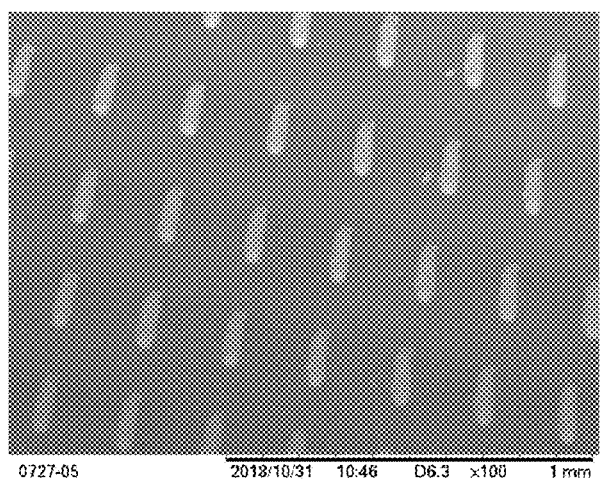
Figure 7C:
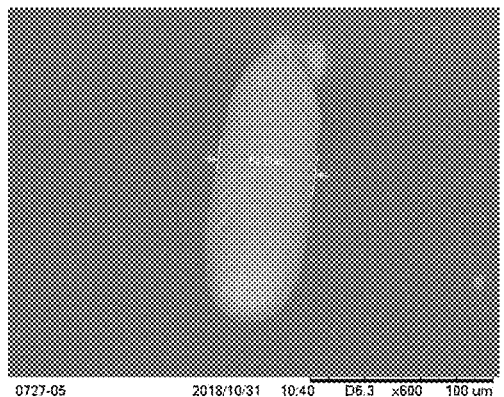
Figure 8:
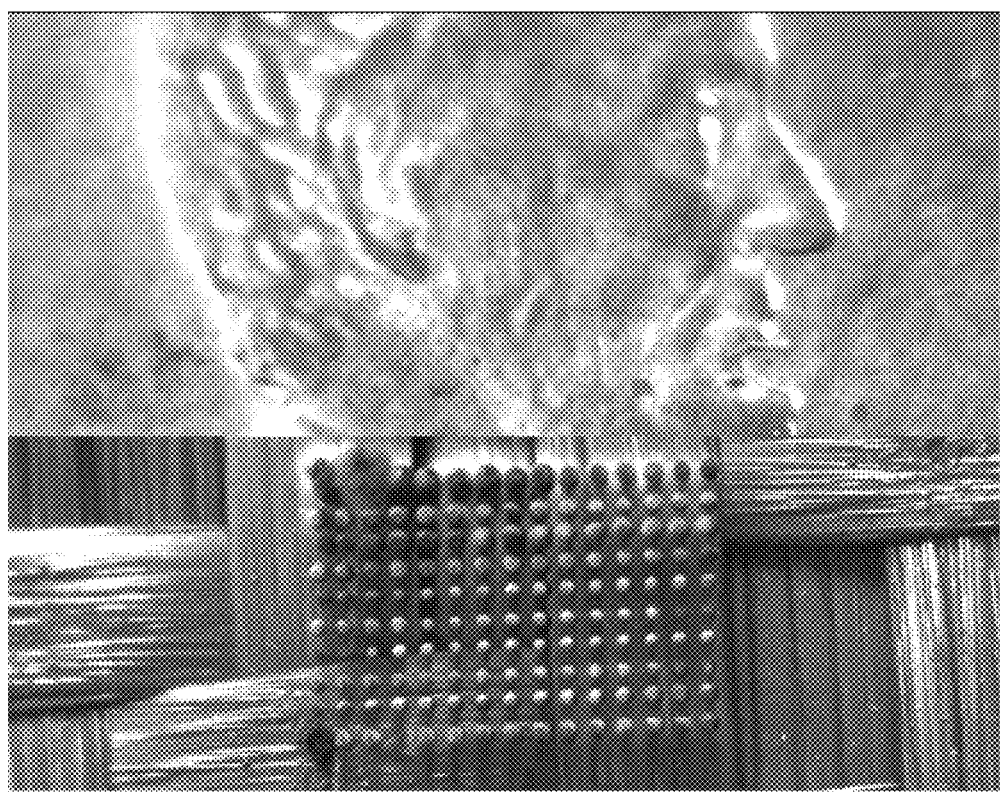
FIG. 8 shows a SiC fiber forest grown on HNS (High Nicalon-Type S) tow SiC fabric, in accordance with one or more aspects of the present invention.

The FFG can be analogized to an FLP turned perpendicular to the surface of a substrate. Doing so generates arrays of short freestanding fibers, up to ~¼" long, as shown in FIGS. 7A-C, which are SEM images of a large array of SiC fiber forests on a glassy carbon substrate at increasing magnifications, respectively, in accordance with one or more aspects of the present invention. Fiber composition and microstructure is inherited from the FLP. Of particular interest to this invention, fiber forests have been grown on a range of substrates. FIG. 8 shows a rectangular array of SiC fibers grown atop a woven HNS fabric. The present inventors now believe these processes can be used to grow fibers on a wide variety of substrates and with a wide variety of precursors.

Summarizing, the present invention builds upon the exemplary technological innovations generally discussed above with respect to FIGS. 2-5 and FIGS. 6-8 respectively. The first innovation—the Fiber Laser Printer (FLP) is the subject of the above-incorporated publications entitled "High Strength Ceramic Fibers and Methods of Fabrication." The second, and more recent, innovation is the Fiber Forest Generator (FFG) which is the subject of the above-incorporated publications entitled "Functional High-Performance Fiber Structure." Both innovations rely on the same principle of Rapid Laser-Induced Chemical Vapor Deposition (R-LCVD) using a laser beam for each per fiber, although the use of a single laser and/or diffraction gratings also fall within the scope of the present invention. In the FLP example, fibers can be self-seeded and the product is a continuous ribbon of identical straight filaments, parallel to each other. In the FFG example, fibers are seeded on a flat substrate, resulting in a massive array of anchored freestanding short filaments, as seen in FIGS. 7A-C, which are SEM images of a large array of SiC fiber forests on a glassy carbon substrate at increasing magnifications, respectively, in accordance with one or more aspects of the present invention.

SiC Powder Formation Example

As one example in accordance with the present invention, for silicon carbide fiber, varying the gas precursor mix can lead to a range of fiber chemistries, from carbon-rich to silicon-rich. In all conditions, the SiC fiber can have a beta phase content greater than 90%. The present inventors have discovered that depending on at the right precursor settings and LCVD deposition parameters, stoichiometric SiC (a 1:1 ratio of Si:C) can be formed in a rough fiber morphology, somewhat akin to loose SiC 'boulders' glued together, because the LCVD deposition process for silicon carbide is a high nucleation-low growth rate regime, forming many nanocrystalline grain sites that do not grow quickly. The resulting SiC fibers can therefore be a friable material that is mechanically weak and breaks apart quite easily.

Figure 9A:
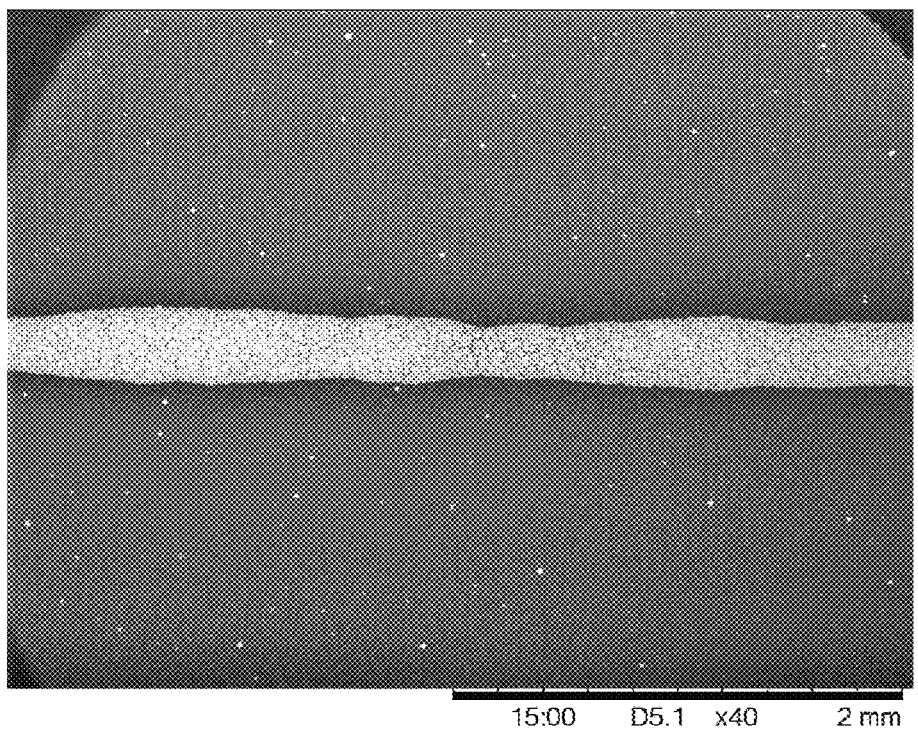
FIGS. 9A-B are SEM images of a SiC fiber and a highly magnified section thereof.
Figure 9B:
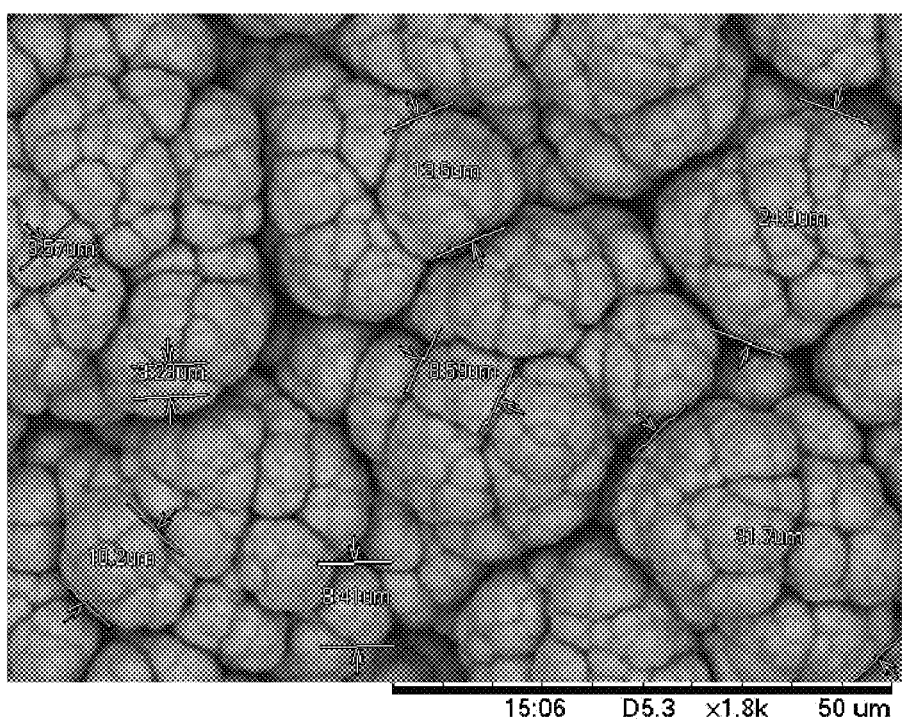
Figure 10A:
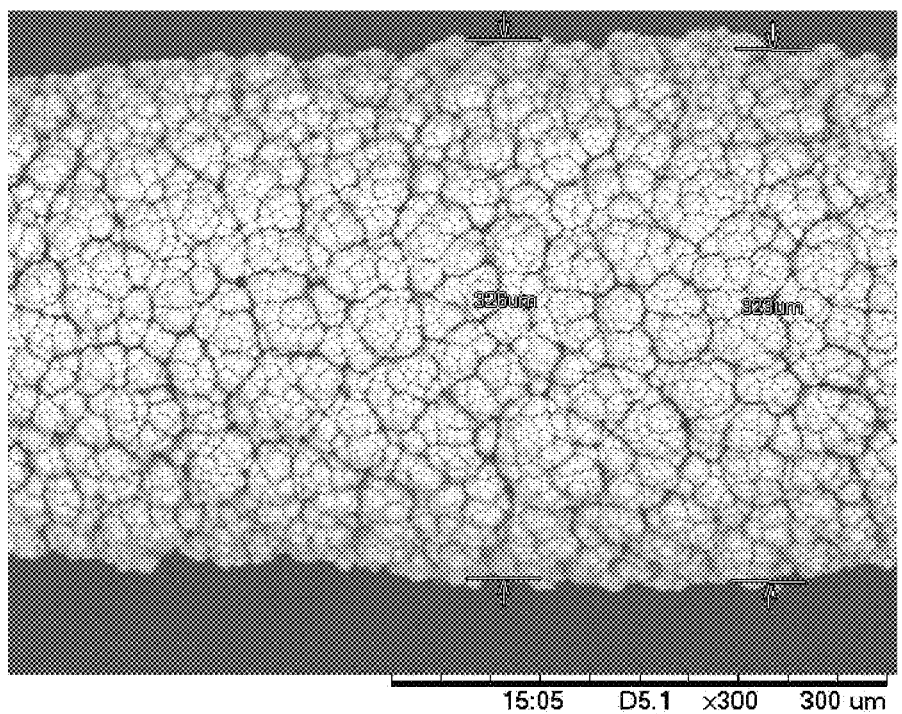
FIGS. 10A-B are SEM images of the SiC fiber of FIG. 8A showing two separate sections thereof of differing diameter.
Figure 10B:
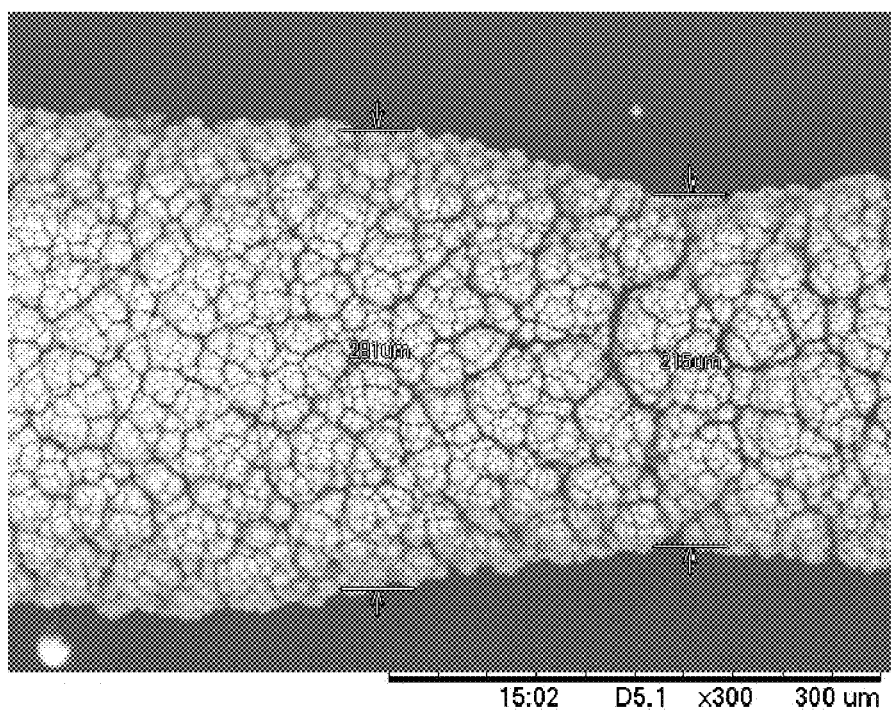

FIGS. 9A-B are SEM images of an SiC fiber (relatively large in diameter—about 200 to 300 um) and a highly magnified section thereof, showing the coarse and friable composition desirable in such fibers, akin to boulders glued together. FIGS. 10A-B are SEM images of the SiC fiber of FIG. 9A showing two separate sections thereof of differing diameter, from about 215 um to about 326 um.

In accordance with the present invention, a light grinding or milling or similar procedure can quickly and efficiently reduce the produced fibers to a coarse and/or ultimately finer granular form, e.g., powder (depending on the level of processing applied).

Figure 11A:
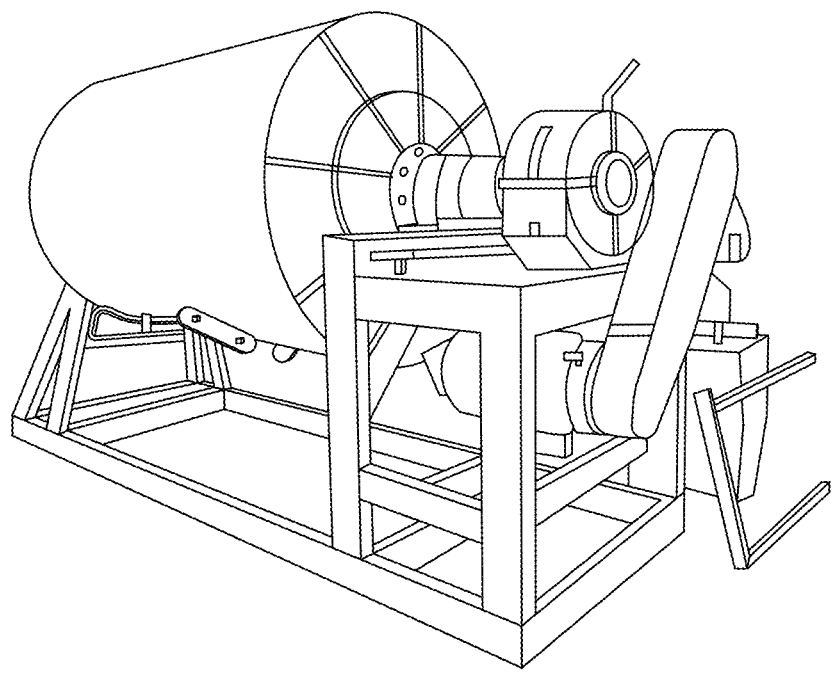
FIGS. 11A-B are schematic drawings of an exemplary ball mill useable for producing the powder from fiber, in accordance with an aspect of the present invention.
Figure 11B:
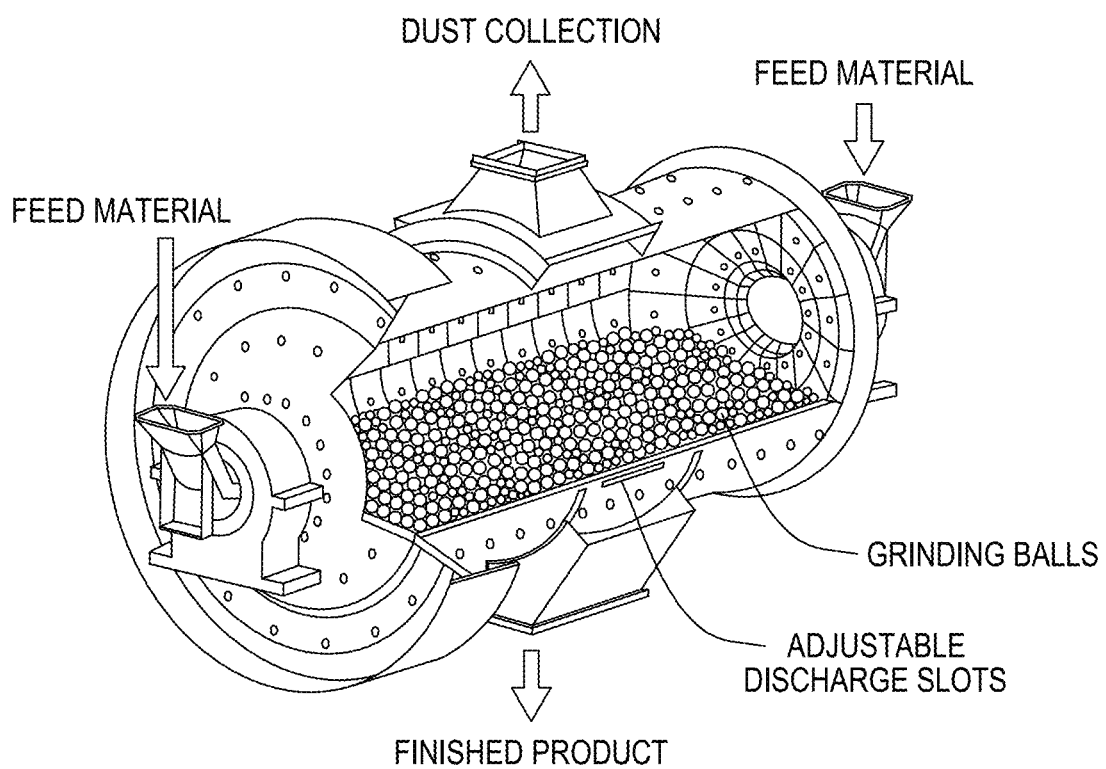

As one example, FIGS. 11A-B are schematic drawings of an exemplary ball mill useable for producing the powder from fiber, in accordance with an aspect of the present invention. Such ball mills are commercially available. In accordance with the present invention, fibers can be deposited into the body as feed material, ground into the appropriate, controllable sizes upon mill activation, and then collected as finished product after milling is complete. Other types of mechanical grinding or milling may be employed in accordance with the present invention, for example, jet milling.

Figure 12A:
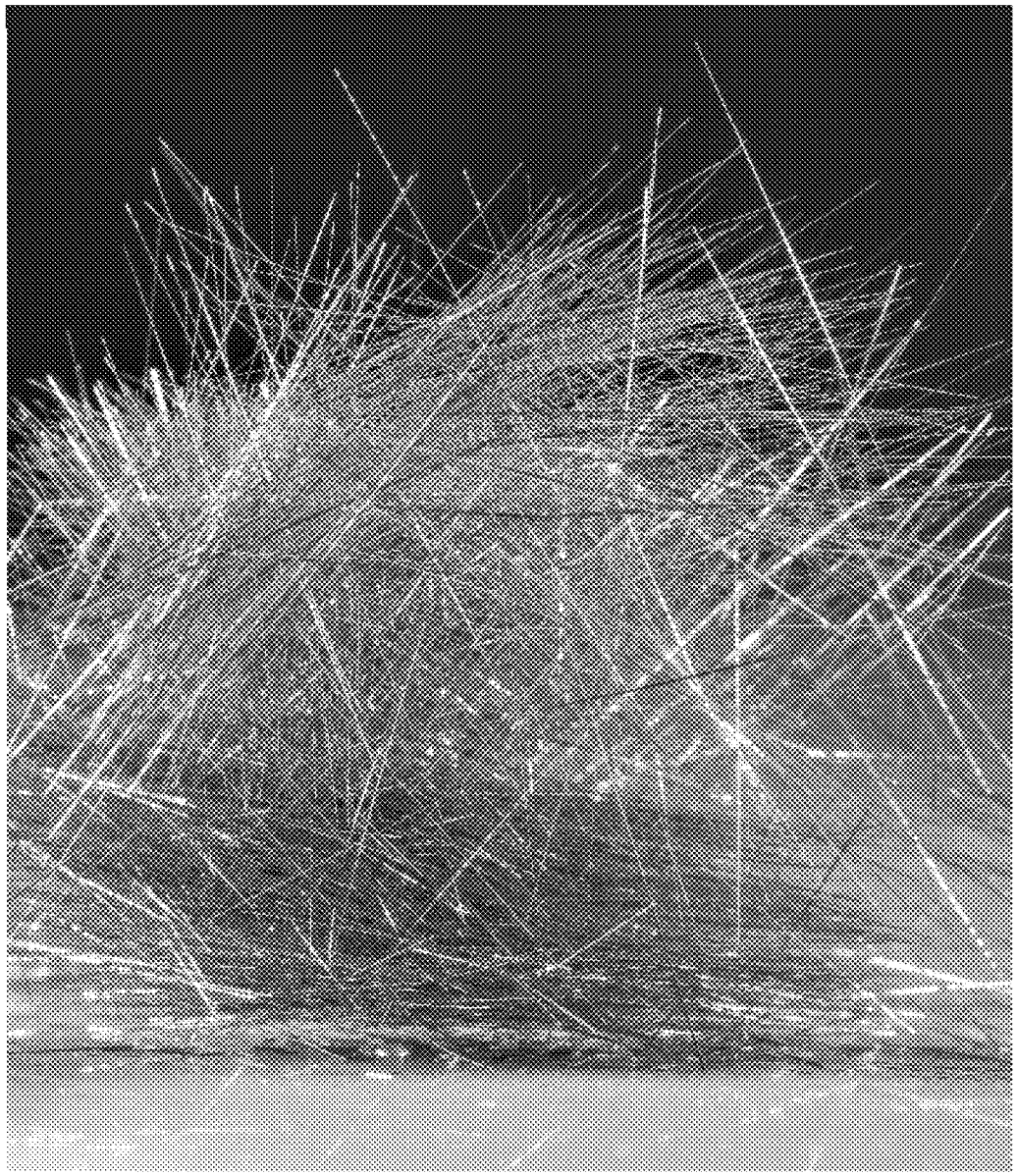
FIGS. 12A & 12B are images of a batch of exemplary fibers (FIG. 12A) and a batch of exemplary powder (FIG. 12B) formed in accordance with the principles of the present invention.
Figure 12B:
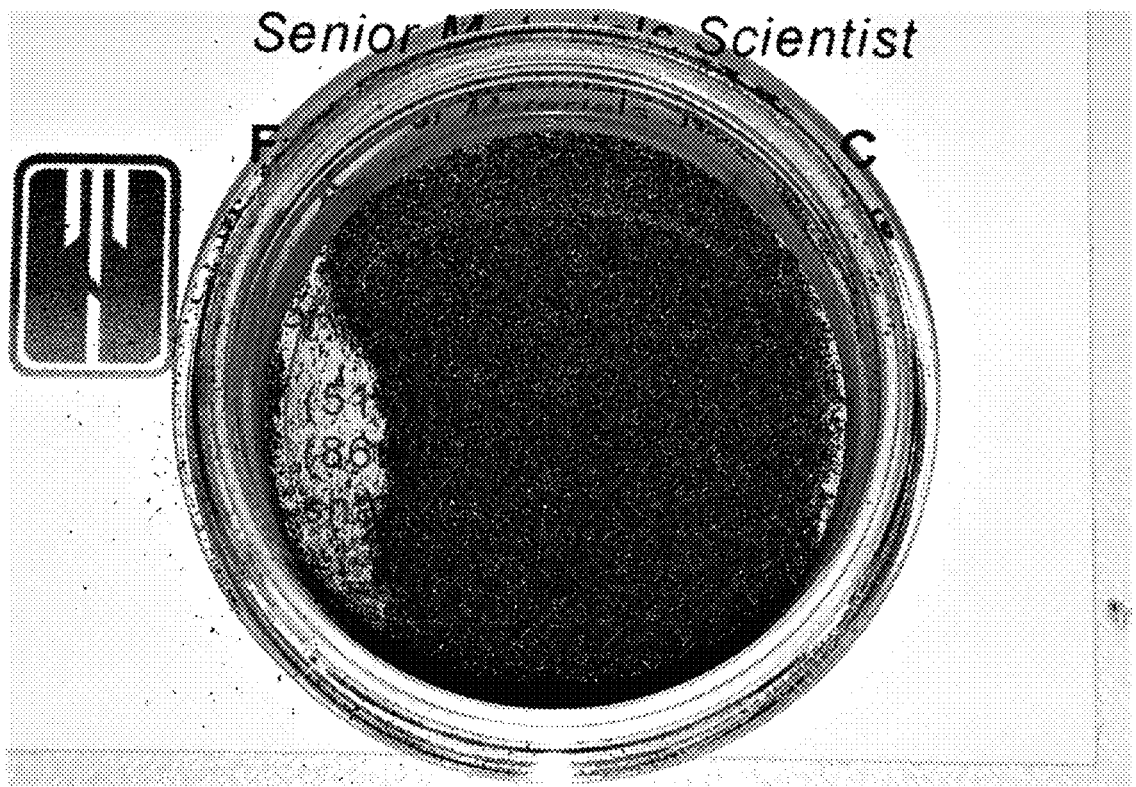
Figure 13:
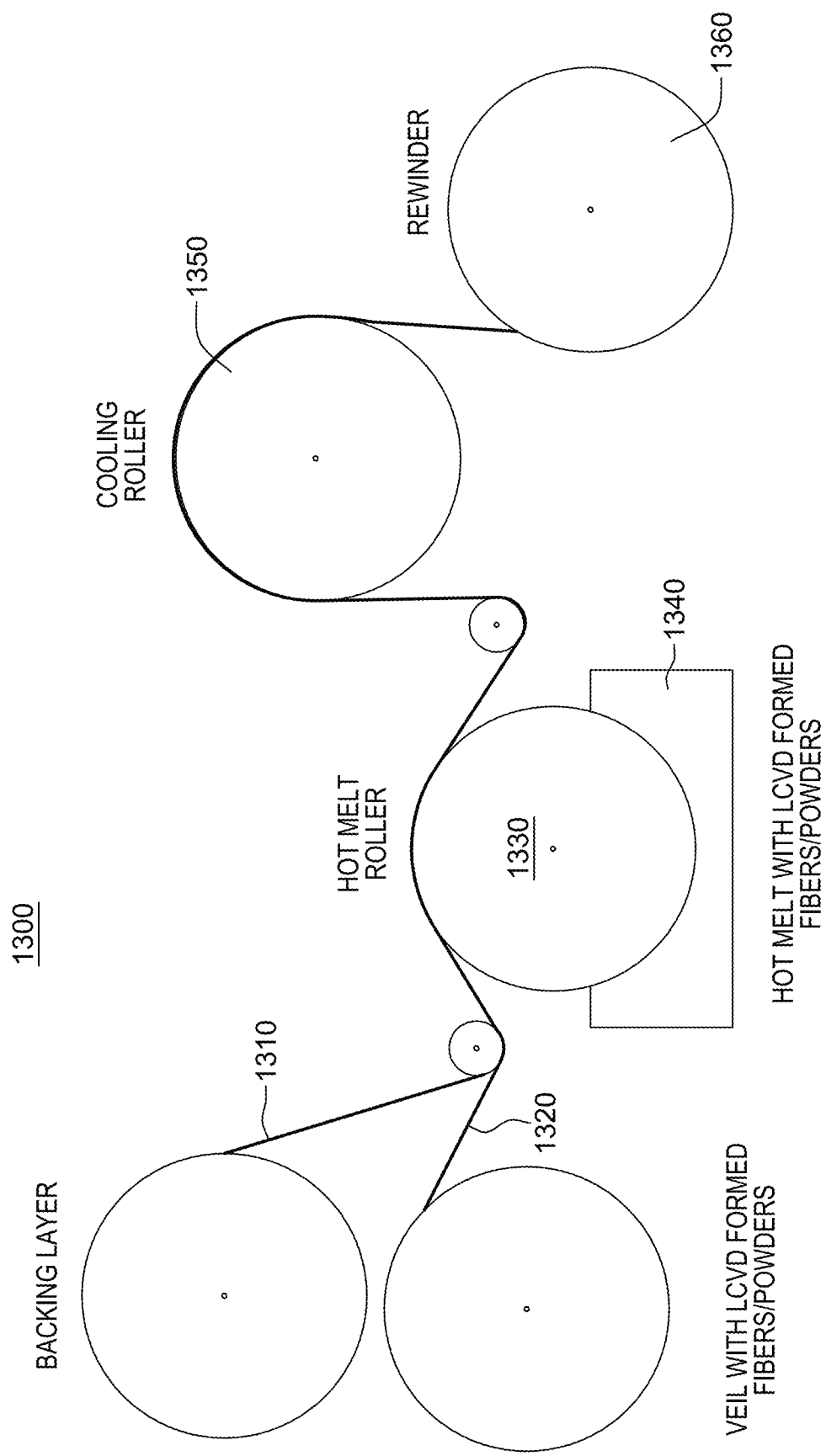
FIG. 13 depicts one embodiment of a system for forming a composite tape using one or more LCVD-formed additive materials, in accordance with one or more aspects of the present invention.

FIG. 12A is an image of a batch of exemplary LCVD-formed fibers, such as LCVD-formed silicon carbide fibers. By way of example, FIG. 12B is an image of a batch of exemplary silicon carbide powder formed in accordance with the principles of the present invention, depicted over a portion of a business card to demonstrate scale.

Another feature of LCVD is the ability to combine multiple gas precursor materials to deliver several elements to the gas phase reaction, resulting in unique compositions that have multiple phases of materials present. For instance, the combination of silane, ammonia, and boron trichloride gases in a LCVD reaction can yield an intimately mixed combination of silicon nitride and boron nitride. In accordance with the present invention, these complex compositions and chemistries then carry through from the fibers to the powder format. Whether in fiber or powder format, these multi-phase materials offer previously unavailable blending of material properties to address high tech application requirements. Therefore, in accordance with the present invention, any additional compositions and/or chemistries formed during the LCVD process will persist in the powder format.

In addition, specific chemical species can be introduced via careful gas precursor selection with the intent of fostering a desired performance behavior in the deposited material, whether the format is in fiber or an ultimate powder form. The amount of the species would be nominally as a trace quantity. For example, a refractory metal, with a melting point above 2000 C, could be added as an in-situ getter in order to capture the free oxygen that is ingressing and thereby enhance the oxidation resistance of the material. Metals like hafnium, zirconium, and titanium would be candidate getters with high affinity for oxygen.

In addition, fiber cores can be formed first, over which the subject materials can be deposited using LCVD (e.g., silicon carbide or other desired materials). Before or after milling, the core material can remain in the fibers, or be removed using any suitable removal process (i.e., heating, solvents, etc.).

Shape And Coating Additions:

In accordance with an aspect of the present invention, the grains formed can also be specially shaped and/or coated. Grains can be milled into a particular shape to maximize their fracture toughness with a high surface area to volume ratio. Optimizing this ratio increases the amount of fracture energy that can be absorbed. For example, a spherical shape can better dissipate fracture energy. Also, coatings (e.g., interphase—boron nitride, carbon, beryllium oxide) can be applied to grains to additionally enhance the composite fracture toughness behavior. Without a coating, grains may be susceptible to failure due to crack propagation through the grain. A coating can absorb and/or deflect a crack, allowing the grains to maintain their mechanical integrity. Additional coatings, such as silicon carbide, can serve as environmental protection barriers for the grains.

The fibers and associated manufacturing techniques discussed herein can attain numerous structures and compositions in accordance with all of the above-incorporated patent applications. Notably, any elements which are desired and which are compatible with the fiber formation processes disclosed herein (e.g., LCVD), and for which a fiber or a granular (or other processed form) is desired, fall within the scope of the present invention.

Summarizing, the present invention in one aspect includes a method of forming a high purity fiber and/or granular material, including providing precursors in a reactor; forming at least part of a fiber in the reactor from the precursors using chemical deposition interacting with said precursors; and forming the granular material from the fiber. In one aspect, the chemical deposition may include laser induced chemical vapor deposition. The granular material may be formed by grinding or milling the fiber into the granular material, e.g., ball milling the fiber.

In another aspect, a plurality of fibers can be formed in parallel using a single laser beam, or multiple laser beams that have independent power control, or multiple laser beams that do not have independent power control. At least one element may be added during the chemical deposition, which serves as a free oxygen getter to improve the oxidation resistance of the granular material; and the granular material can be specially shaped and/or coated.

The granular material may in certain aspects be a silicon carbide powder having greater than 90% beta crystalline phase purity and less than 0.25% oxygen contamination; or a multi-element and multiphase composition powder having less than 0.25% oxygen contamination; or a nuclear fuel material.

Composite Tape:

The fibers and associated manufacturing techniques discussed herein can be used to form, for instance, a laser-driven chemical vapor deposition (LCVD)-formed additive material, in any of a variety of formats and compositions, which can be tailored to provide one or more enhanced properties to a composite tape by providing the LCVD-formed additive material in one or more layers of multiple layers of the composite tape.

The different formats of the LCVD-formed additive material can provide different enhancements to the composite tape. For instance, LCVD-formed granular material (i.e., powder particles) can be provided with a diameter less than 10 microns, which leads to a significant increase in surface area in contact with a matrix resin used in the composite tape. This leads to enhanced stress transfer to the higher strength granular material, such as made from carbides, like silicon carbide, boron carbide, or tungsten carbide, which thereby improves the overall tape composite's fracture strength. Similarly, LCVD-formed granular carbide material can provide enhanced impact resistance and endurance in a composite tape through kinetic energy transfer through the matrix to the particles. The loading volume fractions of the granular material can be 60% or less, such as in the range of 20-60%, in one or more embodiments.

Laser-driven chemical vapor deposition (LCVD)-formed fiber material can be used to reinforce, for instance, the adhesive matrix phase of the composite tape, whether in long continuous or short continuous form. This advantageously enhances the tribological performance, such as wear resistance. Whether in sliding abrasion or direct impact wear, the fiber reinforced composite tape architecture provides load-bearing support that yields a much higher friction coefficient and mechanical fracture resistance than would could be endured by an unreinforced tape material, such as an unreinforced polymer-based tape material. Depending on the structure of the tape, that is, whether the LCVD-formed fiber material is in a non-woven mat layer, or discontinuously and randomly dispersed in an adhesive matrix, the volume loading fractions can be in the range of 20-50 percent volume, in one or more embodiments.

Combining both LCVD-formed fiber material and LCVD-formed granular material for reinforcement of a composite tape yields a high mechanically performing composite tape, with improved fracture strength and wear resistance, but with reduced flexibility and handleability due to the more brittle nature of the material additions, such as carbide material additions. The application of this type of reinforced tape can be focused on the most demanding and aggressive environments, where selection of the surfaces to be covered can be more targeted. Capability to produce this type of hybrid reinforcement architecture is driven by the viscosity of the adhesive matrix and its ability to fully flow into and around the interstices between the granular material (powder particles) and the fibers. The combined loading fraction of the components can be in the range of 20-60%, in one or more embodiments.

As noted initially, there are a wide variety of tape products available. For instance, adhesive tapes can include pressure-sensitive adhesives (PSAs), heat-activated tape, water-activated tape, non-adhesive tapes, films or laminates, etc. Various types of adhesives can be used for tape including, for instance, acrylic adhesives, epoxy resins, rubber-based adhesives, silicone adhesives and sealants, and polyurethane and isocyanate adhesives. Tape typically includes a backing or carrier layer, which can vary widely, depending on the tape produce. By way of example, the backing or carrier layer could be a paper layer, cloth layer, foam layer, metal foil layer, plastic film/polymer, PET/polyester layer, polyimide layer, PVC/vinyl layer, rubber layer, silicone layer, acrylic film layer, glass/fiberglass layer, filament layer, etc. Several representative tape manufacturing processes are described herein by way of example only, in which LCVD-formed or based additive material is to be incorporated.

In packaging tape, polypropylene film is typically unwound from a spool using a tool referred to as an unwinder. The unwinder applies a solvent to the polypropylene film to prevent the film from adhering while the film is unrolled. To transform the film to a tape, one side of the film is coated with an adhesive referred to as a "hot melt". The hot melt can be made from several ingredients, one of which is typically a rubber material. The other constituents are, for example, used to prevent effects caused by ultra-violet radiation, and increase the useful life of the tape. From the hot melt bath, the film with the adhesive applied is passed over a cooling roller to harden the hot melt. With the tape formed, it is made into a roll using a rewinder. With such a tape product, LCVD-formed additive material can be incorporated into, in one embodiment, the hot melt coating the film. Various other embodiments are also possible based on the description provided herein.

Another example is in the fabrication of duct tape, which is a high tear-resistant product that typically has three main layers, an adhesive layer, a cloth layer, and a plastic backing film. The adhesive can be formed by mixing rubber with a resin and then heating the mixture to form a melt. The cloth and the plastic backing film are unrolled together and passed through the melt, where the adhesive goes through the cloth to the backing film to form the tape. The tape is then respooled before slicing into individual rolls.

Production of a composite tape with LCVD-formed additive material would follow a comparable path, one embodiment of which is depicted in FIG. 13. FIG. 13 depicts one embodiment of a fabrication system for forming a composite tape, in accordance with one or more aspects described herein. As illustrated, system 1300 includes a backing layer 1310 and a veil (e.g., cloth or other non-adhesive layer, in one embodiment) with LCVD-formed fiber material and/or LCVD-formed powder material 1320 being unrolled together and passing through a hot melt roller 1330 which applies hot melt from a vat 1340, where the hot melt includes LCVD-formed fiber material and/or LCVD-formed powder material, as described herein. A cooling roller 1350 cools the composite tape, which is rewound on a rewinder 1360. Note that FIG. 13 depicts one embodiment only. In particular, the LCVD-formed additive material could be added to any of the backing layer, adhesive layer and/or one or more other non-adhesive layers (such as, for instance, in the case of a composite duct tape). In terms of processing steps, initially, the rubber can be placed into a heated mixture, with resin pellets to melt and mix the components together to form a tacky, but flowable solid, that can be compressed through rollers and applied to the backing structure. The processing temperature for the mixing procedure can reach up to 150° C., which is needed to melt solid resin pellets, while also softening the rubber feedstock. The temperature regimen is over an order of magnitude lower than the maximum use temperature ranges of the LCVD-formed additive material (such as LCVD-formed carbide material), as described herein. As such, these components can be implemented into the tape fabrication process without any detriment to the fabrication process, while augmenting the tape's mechanical and tribological performance. Using a series of rollers and a calendaring setup, the backing layer (cloth, where present) and adhesive are squeezed together into the tape form.

In one or more embodiments, the adhesive can be supplemented with LCVD-formed granular material, LCVD-formed fiber material, or a mixture of both LCVD-formed powder and fibers, in the same or different layers. Further, the additive materials can be the same, or different types of additive materials, whether in fiber and/or granular form. The cloth layer, when used, can be a veil produced by either continuous or discontinuous LCVD-formed fibers. An advantage of using ceramic LCVD-formed fibers and/or powders is that they impose no upper limit on the temperature used during the processing of the tape. This allows for more advanced backing film and adhesive materials to be provided, which in turn, increases the working temperature of the composite tape.

The added LCVD-formed material can impact the rheology of the flowing tape matrix, generally the adhesive phase, when it is applied to the backing structure during the tape manufacturing process. An incorrect mixture of powder and fiber, or too much of a single additive material, could lead to loaded matrix phase that has too high a viscosity, which prevents the adhesive from flowing and evenly filing the tape cross-section structure. A properly balanced flowability in the loaded matrix, whether with a combination of reinforcement material formats, or the individual components, can be achieved that leads to a usable viscosity in the matrix-casting process. In fact, reinforcement using LCVD-formed additive material, can yield a faster setup of the adhesive matrix due to a higher potential viscosity, positively impacting (i.e., reducing) the processing time. In another format, the use of non-woven veils or mats for the secondary phase, as a separate layer in the tape structure, provides a structural skeleton in which the matrix (LCVD-formed additive material) can efficiently and quickly fill. This yields improved matrix usage and processing rates.

Advantageously, the addition of LCVD-formed granular material (powder) and LCVD-formed fiber material, as reinforcement to a tape structure, converts the tape structure, and in particular, one or more layers of the tape structure, into a composite material, with a blend of performance enhancements related to the material properties of the LCVD-formed granular material and LCVD-formed fiber compositions. For instance, the hardness and high melting temperature of the identified carbide composition additions significantly improves the impact damage and wear resistance at elevated operating temperatures for the composite tape in an application such as adhering the tape to the leading edges of a rotating component, such as rotating helicopter blades. The differing nominal shapes of the rounded, spherical granular particles, and the elongated, cylindrical fiber strands impart different mechanical responses to applied loads and crack propagation, allowing for tailored strength and fracture toughness performance through blending of these two reinforcement formats.

Note that the high-temperature performance of the LCVD-formed additive materials described herein allow for alternative material choices to tape manufacturing, and in particular, allow the use of higher temperature resins and elastomers in the preparation of the mixture for the adhesive layer. Generally, the adhesive on a tape product is of the pressure-sensitive variety, meaning it will stick to a surface through the application of pressure only, and not require any time with solvent release or curing. While natural and synthetic rubbers have a nominal upper-use temperature limit of 180° F. (82° C.), other rubber products known as silicone rubber and fluoroelastomer (FKM) offer maximum application temperatures above 570° F. (300° C.) and 390° F. (200° C.), respectively. The addition of a tackifier (or additive material as described herein) increases the tack, or stickiness, of the adhesive component.

Inclusion of LCVD-formed additive material, whether in granular format or fiber format, and an elevated temperature adhesive layer, allows for optimized mechanical and thermal performance in demanding environments, as the LCVD-formed materials would not suffer from any limitations of performance degradation at the maximum-use temperatures of the other constituent tape materials. The LCVD materials are nominally thermal insulators, and thus would enhance a tape's thermal resistance. In addition, these LCVD-based additive materials are very stable in aggressive chemical environments, with minimal degradation. This behavior translates into improved corrosion resistance in the tape performance.

Specific types of tapes can be engineered for use in desired applications. For instance, a nuclear tape is meant, as the name suggests, for nuclear operations and ship repairs with elevated temperature capability up to 100° C. Not only can the LCVD material enhance the mechanical performance and temperature capability of nuclear tape, it can also be used as a radiation shield if, for instance, $B_4C$ powders and/or fibers are employed, due to the high neutron absorption cross-section of boron. In order to provide adequate irradiation shielding, the $B_4C$ addition would need to be in the 40-60% volume range.

In another embodiment, fiberglass tape is designed for temperature resistance via the inclusion of fiberglass fabric in the tape layer structure. LCVD fiber material addition as a supplemental layer in conjunction with a fiberglass cloth would extend and enhance the thermal capabilities of the overall tape due to the ability to dissipate heat faster with higher thermal conductivity values. In a further embodiment, gaffer's tape is deployed with electrical and audiovisual equipment and is designed to be especially strong and durable to survive indelicate handling of the equipment. Including an LCVD fiber-based layer in a gaffer tape composite architecture would mean improved mechanical endurance, primarily from the higher fracture strength of the LCVD materials. Duct tape is another durable tape, but susceptible to heat degradation at moderately elevated temperatures (greater than 100° F.). Significant additions of LCVD-formed additive material in fiber or granular form to the duct tape structure (e.g., greater than 30% by weight) would enhance the higher temperature performance.

Note that, in one or more embodiments, tungsten (WC) powder, due to the high molecular mass, can be preferred in applications that require impact resistance and endurance from impinging particles, such as rotary mechanical equipment and a sand (e.g., desert) environment.

In other embodiments, silicon carbide (SiC) and boron carbide ($B_4C$) powder can advantageously be used in applications requiring sliding and contact abrasion resistance, such as paired surfaces that move relative to one another in an automotive application. These two would be selected over WC in situations that weight considerations are imperative, as both are of significantly lower density (WC 15.63 g/cm$^3$, SiC 3.21 g/cm$^3$, $B_4C$ 2.52 g/cm$^3$).

Discontinuous short fiber additions to an adhesive mixture of any of the three LCVD carbide materials described above can provide mechanical improvements to the tape strength and toughness by a transfer of the load to the fiber material. The same weight considerations can factor in as identified with the powders.

The LCVD fiber can be included as a supplement to a cloth backing of a tape, either as a non-woven veil, or as a woven fabric, or to another layer of the tape.

Note that the LCVD-formed additive materials described herein are high purity materials, meaning that the LCVD-produced materials do not have any contaminants residual in the formed material product, only the desired elements (e.g., Si and C for silicon carbide). Further, the LCVD-formed material does not have any performance-limiting species, such as oxygen. The high purity nature of the material is also combined with a nanocrystalline microstructure that occurs due to the non-equilibrium nature of the laser deposition process. The fiber structure is generally non-homogeneous/ varying across the radius. The powder material is produced from the fiber feedstock, and therefore is ground and/or milled into micro-sized or sub-micron particles, as described above. The powder retains the microcrystalline nature. Another aspect unique to LCVD-formed additive materials is the ability to make $B_4C$ and WC fibers, which are not commercially available products of these materials.

Note that SiC, $B_4C$ and WC are discussed herein as additive materials due to their excellent wear resistance and impact resistance in composite tape applications. Other ceramics, such as molybdenum carbide and tantalum carbide typically have high-temperature, high-strength properties of ceramic carbides, and can be used in tape composites as described herein as well. Other materials are also possible.

In one or more implementations, the fiber formed by laser chemical vapor deposition (LCVD) is a ceramic and/or other inorganic fiber of a single material. The ceramic and/or other inorganic fiber contains elongated crystal grains in and around the fiber center and oriented along the fiber axis, with a smooth transition from the elongated crystal grains in and around the fiber axis to equiaxed grains at the radial periphery of the fiber, without discontinuity. In one or more embodiments, at least one layer of the composite tape can include a plurality of such fibers. Further, in one or more implementations, the LCVD-formed granular material is formed from a plurality of ceramic and/or other inorganic fibers of the single material as described above by milling or otherwise forming powder from the fibers, where, as noted, the ceramic and/or other inorganic fibers contain elongated crystal grains in and around the fiber center and oriented along the fiber axis, with a smooth transition from the elongated crystal grains in and around the fiber center to equiaxed grains at the radial periphery of the fiber without discontinuity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating a composite tape, the method comprising:
    using laser-driven chemical vapor deposition (LCVD) to form an LCVD-formed additive material, the LCVD-formed additive material including an LCVD-formed fiber material and an LCVD-formed granular material, the LCVD-formed additive material being a single crystalline material, and the using comprising:
        growing, using laser-driven chemical vapor deposition (LCVD), a plurality of fibers;
        milling a first group of fibers of the plurality of fibers into the LCVD-formed granular material; and
        retaining a second group of fibers of the plurality of fibers as the LCVD-formed fiber material; and
    producing the composite tape, the producing including providing both the LCVD-formed fiber material and the LCVD-formed granular material within the composite tape, wherein providing both the LCVD-formed fiber material and the LCVD-formed granular material within the composite tape facilitates dispersion of the LCVD-formed additive material within the composite tape and enhances one or more properties of the composite tape.

2. The method of claim 1, wherein the fabricating includes incorporating the LCVD-formed granular material into an adhesive layer of the composite tape to enhance fracture strength and wear resistance of the composite tape.

3. The method of claim 2, wherein the LCVD-formed granular material comprises a ceramic granular material.

4. The method of claim 3, wherein the ceramic granular material comprises one or more of silicon carbide (SiC), boron carbide ($B_xC_{x-1}$), or tungsten carbide (WC).

5. The method of claim 2, wherein the fabricating includes incorporating the LCVD-formed fiber material into a non-adhesive veil layer of the composite tape to enhance wear resistance of the composite tape.

6. The method of claim 5, wherein the LCVD-formed fiber material comprises a ceramic fiber material.

7. The method of claim 6, wherein the ceramic fiber material comprises one or more of silicon carbide (SiC) fibers, boron carbide ($B_xC_{x-1}$) fibers, or tungsten carbide (WC) fibers.

8. The method of claim 1, wherein the fabricating comprises providing the LCVD-formed fiber material in a first layer of the multiple layers of the composite tape, and providing the LCVD-formed granular material in a second layer of the multiple layers of the composite tape.

9. The method of claim 8, wherein the LCVD-formed granular material comprises ceramic granular material, and the LCVD-formed fiber material comprises ceramic fiber material.

* * * * *